United States Patent
You

(10) Patent No.: US 8,470,696 B2
(45) Date of Patent: *Jun. 25, 2013

(54) LASER MASK AND CRYSTALLIZATION METHOD USING THE SAME

(75) Inventor: JaeSung You, Yeongdeungpo-Gu (KR)

(73) Assignee: LG Display Co., Ltd., Seoul (KR)

( * ) Notice: Subject to any disclaimer, the term of this patent is extended or adjusted under 35 U.S.C. 154(b) by 271 days.

This patent is subject to a terminal disclaimer.

(21) Appl. No.: 13/004,583

(22) Filed: Jan. 11, 2011

(65) Prior Publication Data

US 2011/0104908 A1    May 5, 2011

Related U.S. Application Data

(62) Division of application No. 12/728,548, filed on Mar. 22, 2010, now Pat. No. 7,892,955, and a division of application No. 11/987,233, filed on Nov. 28, 2007, now Pat. No. 7,714,331, and a division of application No. 10/962,509, filed on Oct. 13, 2004, now Pat. No. 7,316,871.

(30) Foreign Application Priority Data

Dec. 29, 2003   (KR) .................................. 2003-99387

(51) Int. Cl.
*G03F 1/00*       (2012.01)
(52) U.S. Cl.
USPC .. 438/487; 430/5; 257/E21.134; 257/E21.703
(58) Field of Classification Search
USPC ......... 257/E21.134, E21.497; 438/487; 430/5
See application file for complete search history.

(56) References Cited

U.S. PATENT DOCUMENTS

| | | | |
|---|---|---|---|
| 6,528,820 B1 | 3/2003 | Yamazaki et al. | |
| 6,667,198 B2 * | 12/2003 | Shimoto et al. | 438/166 |
| 6,767,804 B2 | 7/2004 | Crowder | |
| 6,867,151 B2 * | 3/2005 | Jung | 438/778 |
| 6,875,547 B2 | 4/2005 | Kim | |
| 7,892,955 B2 * | 2/2011 | You | 438/487 |
| 2002/0104750 A1 | 8/2002 | Ito | |
| 2002/0179001 A1 | 12/2002 | Jung | |
| 2002/0179004 A1 | 12/2002 | Jung | |
| 2003/0022421 A1 | 1/2003 | Shimoto et al. | |
| 2003/0088848 A1 | 5/2003 | Crowder | |
| 2003/0175599 A1 | 9/2003 | Voutsas et al. | |
| 2003/0196589 A1 | 10/2003 | Mitani et al. | |
| 2004/0224487 A1 | 11/2004 | Yang | |
| 2004/0235277 A1 | 11/2004 | Crowder | |

FOREIGN PATENT DOCUMENTS

| | | |
|---|---|---|
| DE | 103 29 332 | 7/2004 |
| GB | 2396962 | 7/2004 |
| JP | 2003-045803 | 2/2003 |
| JP | 2003-051445 | 2/2003 |
| JP | 2003-109903 | 4/2003 |

(Continued)

*Primary Examiner* — Minh-Loan T Tran
(74) *Attorney, Agent, or Firm* — McKenna, Long & Aldridge, LLP.

(57) ABSTRACT

A crystallization method using a mask includes providing a substrate having a semiconductor layer; positioning a mask over the substrate, the mask having first, second and third blocks, each block having a periodic pattern including a plurality of transmitting regions and a blocking region, the periodic pattern of the first block having a first position, the periodic pattern of the second block having a second position, the periodic pattern of the third block having a third position, the first, second and third positions being different from each other; and crystallizing the semiconductor layer by irradiating a laser beam through the mask.

12 Claims, 23 Drawing Sheets

FOREIGN PATENT DOCUMENTS

| | | |
|---|---|---|
| JP | 2003-309080 | 10/2003 |
| JP | 2005-197657 | 7/2005 |
| WO | WO 01/18854 | 3/2001 |
| WO | WO 2004/017382 | 2/2004 |

\* cited by examiner

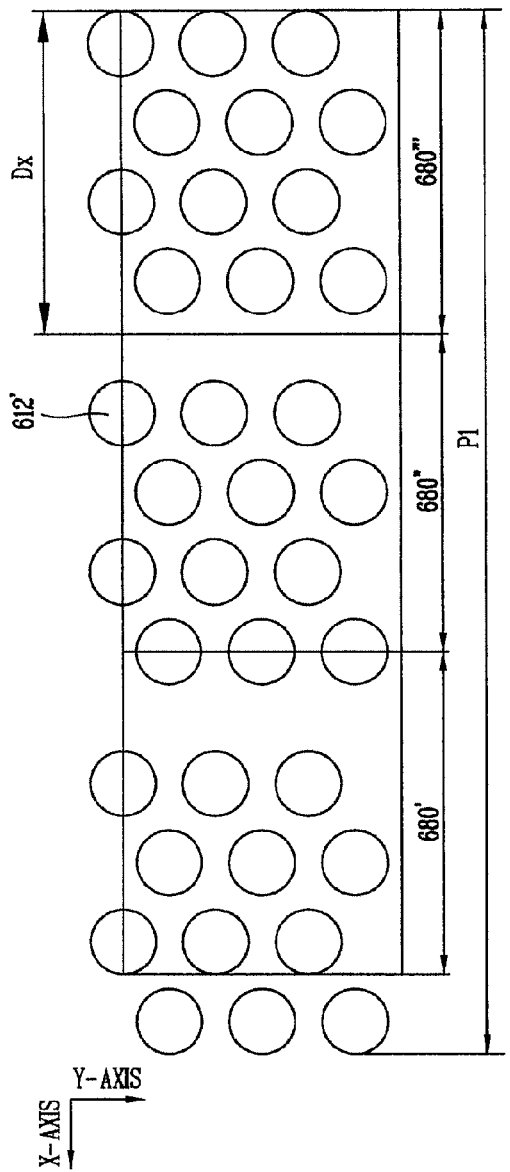
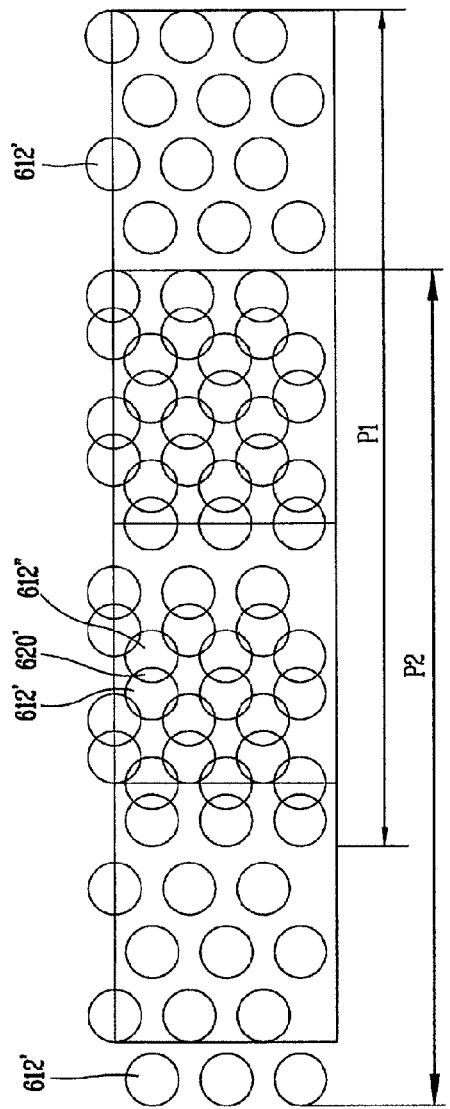
FIG. 16A
FIG. 16B

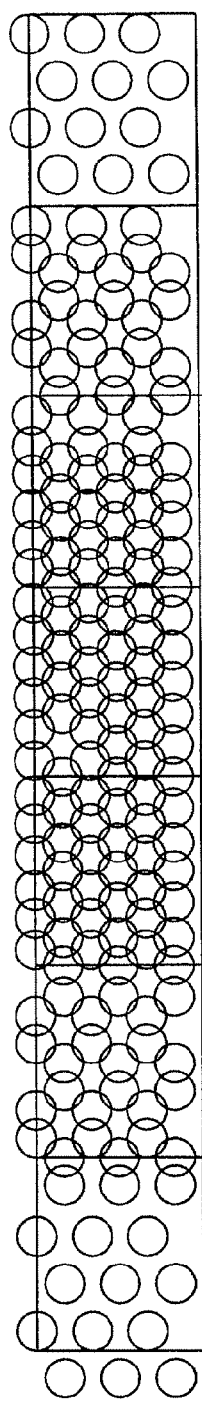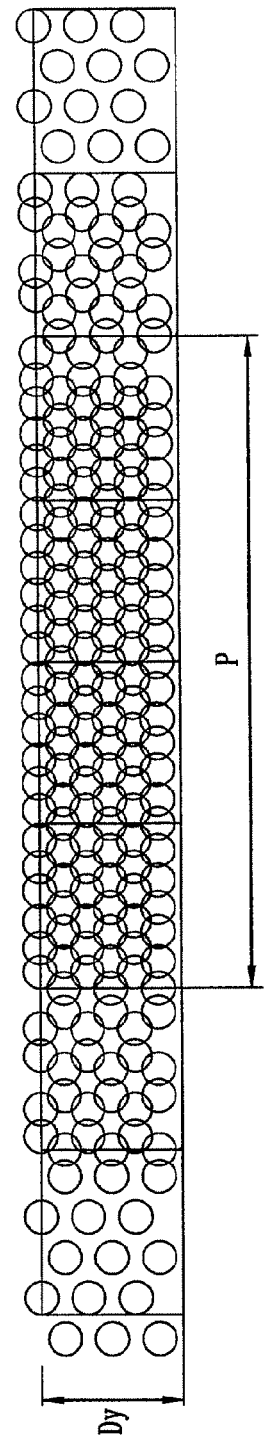
FIG. 16E
FIG. 16F

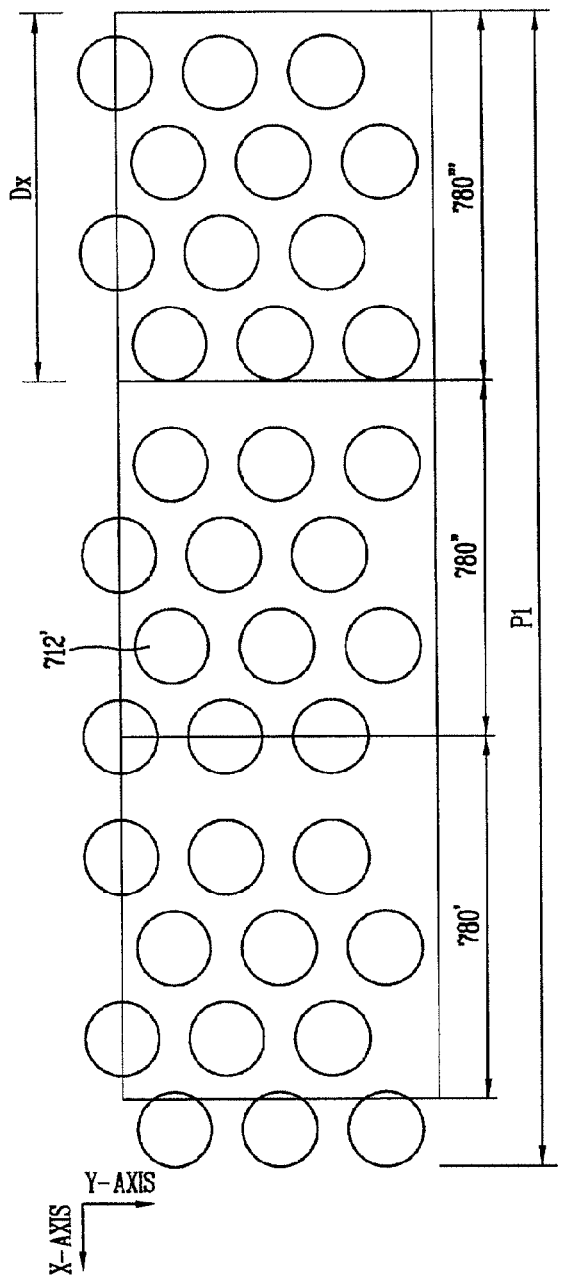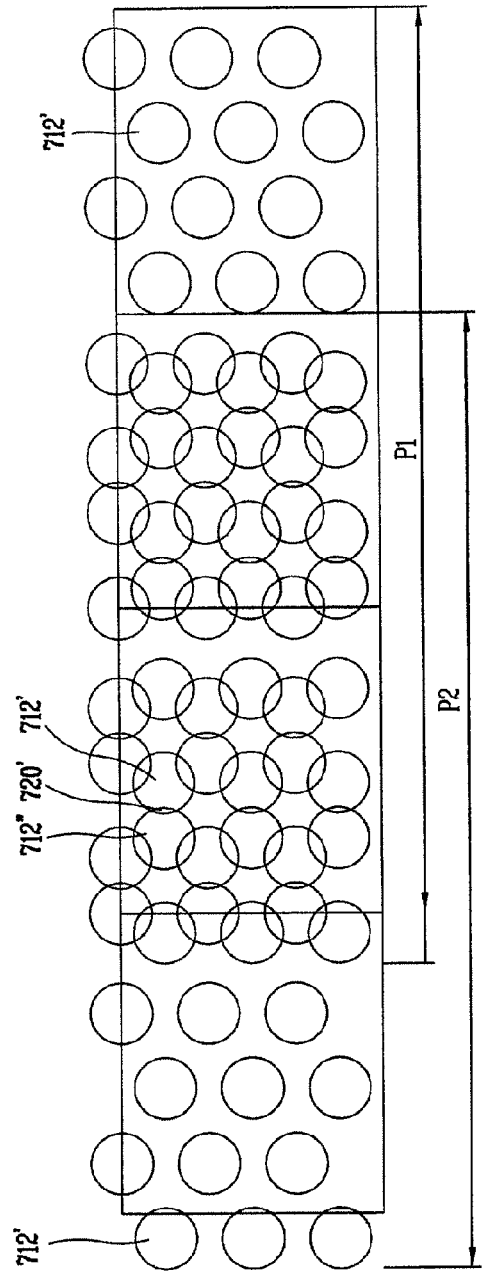
FIG. 19A
FIG. 19B

LASER MASK AND CRYSTALLIZATION METHOD USING THE SAME

This application is a divisional of U.S. patent application Ser. No. 12/728,548, filed Mar. 22, 2010 now U.S. Pat. No. 7,892,955, a divisional of U.S. patent application Ser. No. 11/987,233, filed Nov. 28, 2007, now U.S. Pat. No. 7,714,331, a divisional of U.S. patent application Ser. No. 10/962,509, filed Oct. 13, 2004, now U.S. Pat. No. 7,316,871, which all claim the benefit of Korean Patent Application No. 2003-99387, filed on Dec. 29, 2003, which is hereby incorporated by reference for all purposes as if fully set forth herein.

BACKGROUND OF THE INVENTION

1. Field of the Invention

The present invention relates to a laser mask and a crystallization method using the same, and more particularly, to a laser mask and a crystallization method using the same that can improve the crystallization characteristics of silicon thin film.

2. Discussion of the Related Art

Recently, due to the needs for information displays, especially for portable information displays, thin film type flat panel display (FPD) devices have been actively being researched and commercialized such that the cathode ray tubes (CRT) are being replaced. Of these flat panel display devices, a liquid crystal display (LCD) device displays images using an optical anisotropy of liquid crystal. An LCD device can be used for notebook computers, desktop monitors, and other display devices, due to its excellent resolution, color rendering capability and picture quality.

An active matrix (AM) driving method, a typical driving method used in the LCD device, drives each of the pixels of the LCD device using an amorphous silicon thin film transistor (a-Si TFT) as a switching device. The a-Si TFT technique was described by English LeComber et al. in 1979, and was commercialized as a three-inch liquid crystal portable television in 1986. Recently, a TFT-LCD device with a display area of more than 50 inches has been developed. However, the field effect mobility of the a-Si TFT is about 1 $cm^2/Vsec$, which prevents its use in peripheral circuits that apply signals to the pixels, because the peripheral circuits generally operate at more than 1 MHz. Accordingly, researches for simultaneously forming switching transistors in a pixel region and peripheral circuits in a driving circuit region on a glass substrate using a polycrystalline silicon (poly-Si) TFT having a field effect mobility greater than that of the a-Si TFT have been actively pursued.

The poly-Si TFT has been applied to small flat panel displays, such as the eyepiece of camcorders, since an LCD color television was developed in 1982. Such a TFT has low photosensitivity and high field effect mobility, and it can be directly fabricated on a substrate to form driving circuits. Increased mobility can increase the operation frequency of the driving circuits. The frequency capability of the driving circuits determines the number of the pixels that can be driven while maintaining adequate display capability. More specifically, the increased frequency decreases the charging time of a signal applied to a pixel such that distortion of the signal is decreased and the picture quality increases. Compared to the a-Si TFT, which has a high driving voltage of about 25V, the poly-Si TFT, which has a driving voltage of under 10V, consumes less power.

The poly-Si TFT can be fabricated by directly depositing a polycrystalline silicon thin film on a substrate or by depositing an amorphous silicon thin film that is then crystallized by a thermal process. To use a cheap glass as a substrate, low temperature processes are required, and, to use the poly-Si TFT for driving circuits, a method for increasing the field effect mobility is required. In general, thermal processing methods for crystallizing an amorphous silicon thin film are the solid phase crystallization (SPC) method and the excimer laser annealing (ELA) method.

The SPC method forms a polycrystalline silicon thin film at a low temperature of approximately 600° C. In this method, a polycrystalline silicon thin film is formed by depositing an amorphous silicon thin film on a glass substrate having a low melting point and then by performing a slow heating process at approximately 600° C. for up to tens of hours. A polycrystalline silicon thin film obtained by the SPC method has comparatively large-size grains of about several μm (micrometers). However, there are many defects in the grains. Although not as bad as grain boundaries in a poly-Si TFT, these defects affect negatively on the performance of a poly-Si TFT.

The excimer laser annealing method is a typical method of fabricating a poly-Si TFT at a low temperature. The excimer laser crystallizes an amorphous silicon thin film by irradiating a high energy laser beam onto the amorphous silicon thin film for a time of ten nanoseconds. In this method, the amorphous silicon is melted and crystallized in a very short time, so that the glass substrate is not damaged. A polycrystalline silicon thin film fabricated by the excimer laser method also has excellent electrical characteristics, compared to a poly-Si thin film fabricated by a general thermal processing method. For example, a field effect mobility of a poly-Si TFT fabricated by the excimer laser method is more than 100 $cm^2/Vsec$, whereas a field effect mobility of an a-Si TFT is 0.1~0.2 $cm^2/Vsec$ and a field effect mobility of a poly-Si TFT fabricated by a general thermal processing method is 10~20 $cm^2/Vsec$ (IEEE Trans. Electron Devices, vol. 36, no. 12, p. 2868, 1989).

A crystallization method using a laser will now be described in detail. FIG. 1 is a graph illustrating a relationship between a grain size of a polycrystalline silicon thin film and an energy density of a laser used to form the polycrystalline silicon thin film.

As shown in FIG. 1, in the first and second regions I and II, as the energy density increases, the grain size of the polycrystalline silicon thin film increases, as discussed in IEEE Electron Device Letters, DEL-7, 276, 1986. However, in the third region III, when the energy density becomes higher than a specific energy density Ec, the grain size of the crystallized polycrystalline silicon thin film decreases drastically. That is, according to the graph shown in FIG. 1, the crystallization mechanism for the silicon thin film becomes different when the energy density is higher than a specific energy density Ec.

FIGS. 2A to 2C, 3A to 3C and 4A to 4C are sectional views illustrating silicon crystallization mechanisms according to the laser energy densities of FIG. 1. That is, they illustrate sequential crystallization process according to each laser energy density. A crystallization mechanism of amorphous silicon by a laser annealing is influenced by many factors, such as laser irradiation conditions including laser energy density, irradiation pressure, substrate temperature, and physical/geometrical characteristics including absorption coefficient, thermal conductivity, mass, impurity containing degree and amorphous silicon layer thickness.

First, as shown in FIGS. 2A to 2C, the first region (I) of FIG. 1 is a partial melting region, and an amorphous silicon thin film 12 is crystallized only up to the dotted line and a size of a grain G1 formed at this time is about hundreds Å. When a laser beam is irradiated on the amorphous silicon thin film 12 on a substrate 10 where a buffer layer 11 is formed, the amorphous silicon thin film 12 is melted. At this time, because strong laser energy is irradiated directly at a surface of the amorphous silicon thin film 12 and relatively weak laser energy is irradiated at a lower portion of the amorphous silicon thin film 12, a certain portion of the amorphous silicon thin film 12 is melted. As a result, crystallization is partially performed.

Typically, in the laser crystallization method, crystals grow through the processes of primary melting in which a surface layer of an amorphous silicon thin film is melted by a laser irradiation, secondary melting in which a lower portion of the amorphous silicon thin film is melted by the latent heat generated during the solidification of the melted silicon, and the solidification of the lower layer. These crystal growth processes will be explained in more detail.

An amorphous silicon thin film on which a laser beam is irradiated has a melting temperature of more than 1000° C. and primarily melts into a liquid state. Because there is a great temperature difference between the surface melted layer and the lower silicon and substrate, the surface melted layer cools fast until solid phase nucleation and solidification are achieved. The surface layer remains melted until the solid phase nucleation and solidification are completed. The melting state lasts for a long time when the laser energy density is high or thermal emission to the outside is low. Because the surface layer melts at a lower temperature than the melting temperature of 1400° C. for crystalline silicon, the surface layer cools and maintains a super-cooled state where the temperature is lower than the phase transition temperature.

The greater the super-cooling state is, that is, the lower the melting temperature of the thin film or the faster the cooling speed is, the greater the nucleation rate is at the time of the solidification such that fine crystals grow during the solidification. When the solidification starts as the melted surface layer cools, crystals grow in an upward direction from a crystal nucleus. At this time, latent heat is generated during the phase transition of the melted surface layer from liquid state to solid state, and thus the secondarily melting begins where the lower amorphous silicon thin film melts. Then, the solidification of the lower amorphous silicon thin film occurs. At this time, the nucleus generation rate of the lower second melted layer increases, because the lower amorphous silicon thin film is more super-cooled than the first melted layer. Thus, the crystal size resulting from the second melted layer is smaller. Accordingly, the cooling speed of the solidification has to be reduced to improve the crystalline characteristics. Cooling speed can be reduced by restraining absorbed laser energy from being emitted to the outside. Examples of the restraining method are heating the substrate, double beam irradiation, or inserting a buffer insulating layer between the substrate and the amorphous silicon layer.

FIGS. 3A to 3C are sectional views illustrating the silicon crystallization mechanism of the second region (II) of FIG. 1, in which the second region (II) represents a near-completely crystallized region.

Referring to FIGS. 3A to 3C, a polycrystalline silicon thin film has relatively large grains 30A-30C of about 3000 to 4000 Å formed down to the interface of the lower buffer layer 11. When a nearly complete melting energy, not a complete melting energy, is irradiated on the amorphous silicon thin film 12, almost all of the amorphous silicon thin film 12 down close to the buffer layer 11 melts. At this time, solid seeds 35 that have not been melted at the interface between the melted silicon thin film 12' and the buffer layer 11 work as a crystallization nucleus to induce side growth, thereby forming the relatively large grains 30A-30C (J. Appl. Phys. 82, 4086).

However, because this crystallization only occurs when the laser energy is such that the solid seeds 35 remain on the interface with the buffer layer 11, the process margin is very limited. In addition, because the solid seeds 35 are generated non-uniformly, the crystallized grains 30A-30C of the polycrystalline silicon thin film have different crystallization directions, thereby resulting in non-uniform crystallization characteristics.

FIGS. 4A to 4C are sectional views illustrating the silicon crystallization mechanism of the third region (III) of FIG. 1 corresponding to a completely crystallized region.

Referring to FIGS. 4A to 4C, very small grains 30 are irregularly formed with a energy density corresponding to the third region (III). When the laser energy density becomes higher than a specific energy density Ec, sufficient energy is applied enough to completely melt the amorphous silicon thin film 12, leaving no solid seeds that may be grown to grains. Thereafter, the silicon thin film 12' which has been melted upon receiving the laser beam of the strong energy undergoes a rapid cooling process, which generates a plurality of uniform nuclei 35 and thus fine grains 30.

Meanwhile, an excimer laser annealing method employing a pulse-type laser is typically used for the laser crystallization, and a sequential lateral solidification (SLS) method, which shows remarkable improvement of crystallization characteristics by growing grains in a horizontal direction, has recently been proposed and studied widely.

The sequential lateral solidification (SLS) utilizes the fact that grains grow laterally from an interface between liquid phase silicon and solid phase silicon (Robert S. Sposilli, M. A. Crowder, and James S. Im, Mat. Res. Soc. Symp. Proc. Vol. 452, 956 to 957, 1997). In this method, grains grow laterally with a predetermined length by controlling the laser energy density and irradiation range of a laser beam, thereby increasing the size of silicon grains.

This SLS is one example of lateral solidification (LS), and the crystallization mechanism with respect to the LS will now be described with reference to the accompanying drawings. FIGS. 5A to 5C are sectional views illustrating a sequential crystallization process according to a related art.

Referring to FIG. 5A, when a laser having an energy density in the third region (III) of FIG. 1, the energy density capable of completely melting an amorphous silicon thin film 112, is irradiated onto a portion of an amorphous silicon thin film 112, the portion of the amorphous silicon film completely melts. A patterned mask can be employed to form a laser irradiated region and a laser non-irradiated region. At this time, as shown in FIGS. 5B and 5C, because the laser has sufficient energy, the amorphous silicon thin film 112 irradiated by the laser can be completely melted. However, the laser beam is irradiated with certain intervals on the amorphous silicon thin film 112, crystals grow from the interface between the silicon thin film 112 of the laser non-irradiated region (solid phase) and the melted silicon thin film 112' (liquid phase).

Thus, the interface provides nuclei for this crystallization. In other words, immediately after the laser beam is irradiated, the melted silicon thin film 112' cools from the left/right surfaces, the interfaces of the laser non-irradiated region. This is because the solid phase amorphous silicon thin film 112 has higher heat conductivity than the buffer layer 111 or the glass substrate 110 below the silicon thin films 112 and 112'. Accordingly, the melted silicon thin film 112' first reaches a nucleus formation temperature at the interface between the horizontal solid phase and the liquid phase, rather than at the central portion, forming a crystal nucleus at the corresponding portion. After the crystal nucleus is formed, grains 130A and 130B horizontally grow from a low temperature side to a high temperature side, that is, from the interface to the central portion. Due to the lateral crystallization, large-size grains 130A and 130B can be formed, and because the process is performed with the energy density of the third region, the process margin is not limited, compared to other regions. However, the SLS has the following problems.

That is, the crystallization is performed by infinitesimally and repeatedly moving the mask or the stage in order to increase the size of the grains. As a result, the process time for crystallizing a large-size amorphous silicon thin film is lengthened and the process yield becomes low.

SUMMARY OF THE INVENTION

Accordingly, the present invention is directed to a laser mask and a crystallization method using the same that substantially obviates one or more of the problems due to limitations and disadvantages of the related art.

An advantage of the present invention is to provide a laser mask and a crystallization method using the same that can improve the crystallization characteristics of silicon thin film.

Still another advantage of the present invention is to provide a liquid crystal display device including a silicon thin film having improved crystallization characteristics fabricated by the crystallization method described herein.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a laser mask includes first, second and third blocks, each block having a periodic pattern including a plurality of transmitting regions and a blocking region, the periodic pattern of the first block having a first position, the periodic pattern of the second block having a second position, the periodic pattern of the third block having a third position, the first, second and third positions being different from each other.

In another aspect of the present invention, a crystallization method using a mask includes providing a substrate having a semiconductor layer; positioning a mask over the substrate, the mask having first, second and third blocks, each block having a periodic pattern including a plurality of transmitting regions and a blocking region, the periodic pattern of the first block having a first position, the periodic pattern of the second block having a second position, the periodic pattern of the third block having a third position, the first, second and third positions being different from each other; and crystallizing the semiconductor layer by irradiating a laser beam through the mask.

In another aspect of the present invention, a display device includes a gate line and a data line crossing each other to form a pixel; a thin film transistor (TFT) near the crossing, the TFT including a polycrystalline silicon layer, wherein the polycrystalline silicon layer includes a plurality of circular crystals, and the three adjacent circular crystals form one equilateral triangle, and six of the equilateral triangles form a regular hexagon.

In yet another aspect of the present invention, a display device includes a gate line and a data line crossing each other to form a pixel; a thin film transistor (TNT) near the crossing, the TFT including a polycrystalline silicon layer, wherein the polycrystalline silicon layer includes a plurality of crystals having a polygon shape, and the centers of the three adjacent crystals form one equilateral triangle, and six of the equilateral triangles form a regular hexagon.

In still another aspect of the present invention, a method for fabricating a display device includes forming a plurality of gate lines and data lines on a substrate, the gate and data lines crossing each other to define pixels; and forming a thin film transistor (TFT) near each crossing in the pixel, this step further including forming a semiconductor layer on the substrate; positioning a mask over the substrate, the mask having first, second and third blocks, each block having a periodic pattern including a plurality of transmitting regions and a blocking region, the periodic pattern of the first block having a first position, the periodic pattern of the second block having a second position, the periodic pattern of the third block having a third position, the first, second and third positions being different from each other; crystallizing the semiconductor layer by irradiating a laser beam through the mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 16A to 16H illustrates a sequential process for crystallizing a silicon thin film using the laser mask shown in FIG. 15B.

FIGS. 19A to 19G illustrates a sequential process for crystallizing a silicon thin film using the laser mask shown in FIG. 18B.

DETAILED DESCRIPTION OF THE ILLUSTRATED EMBODIMENTS

Reference will now be made in detail to the embodiments of the present invention, examples of which are illustrated in the accompanying drawings.

Figure 1:
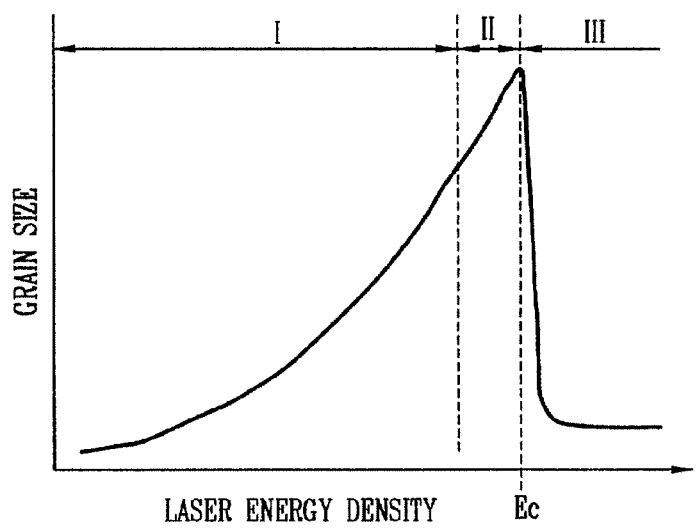
FIG. 1 is a graph illustrating a relationship between a grain size of a polycrystalline silicon thin film and an energy density of a laser used to form the polycrystalline silicon thin film.
Figure 2A:
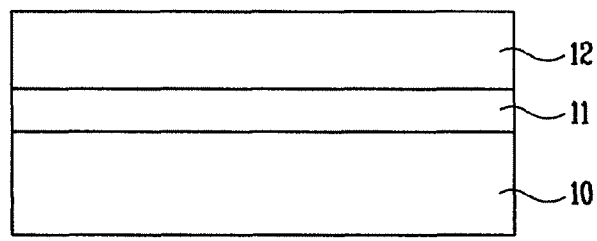
FIGS. 2 to 4 are sectional views illustrating silicon crystallization mechanisms according to the laser energy densities of FIG. 1.
Figure 2B:
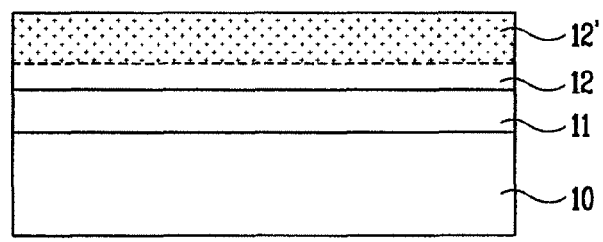
Figure 2C:
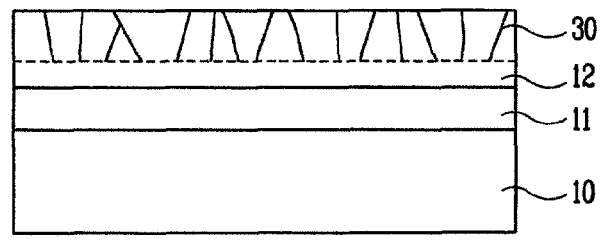
Figure 3A:
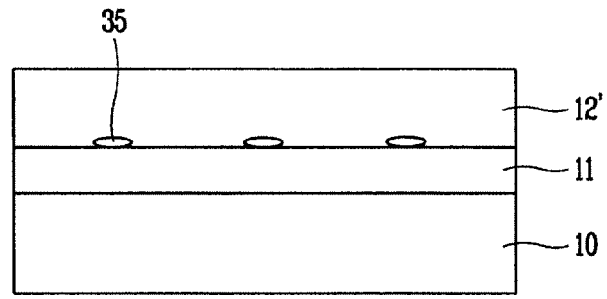
Figure 3B:
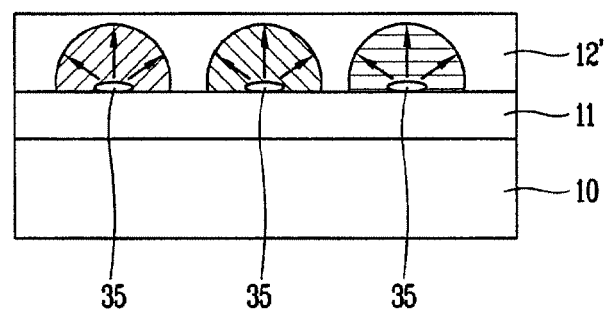
Figure 3C:
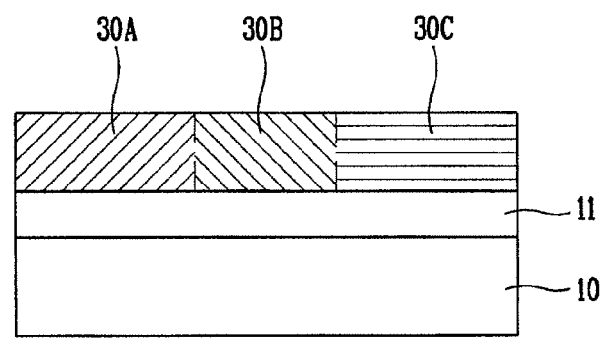
Figure 4A:
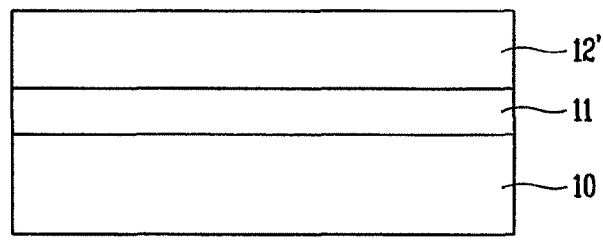
Figure 4B:
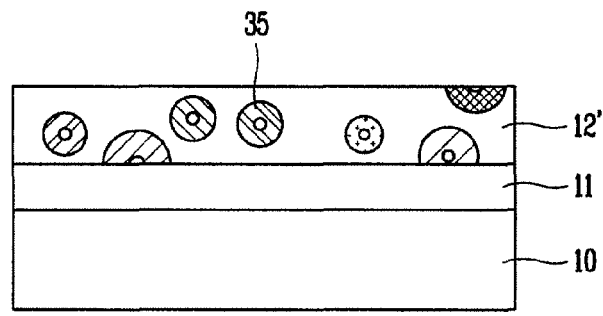
Figure 4C:
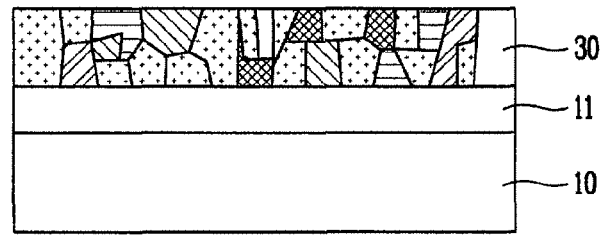
Figure 5A:
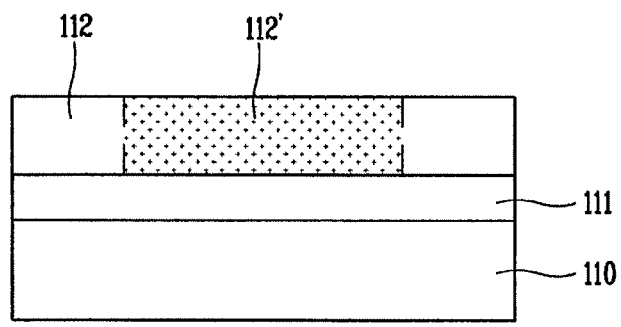
FIG. 5A to 5C are sectional views illustrating a sequential crystallization process according to a related art.
Figure 5B:
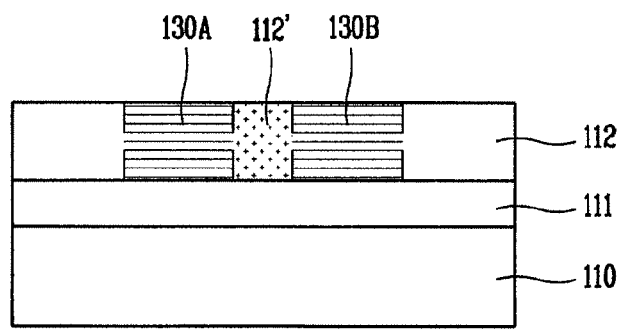
Figure 5C:
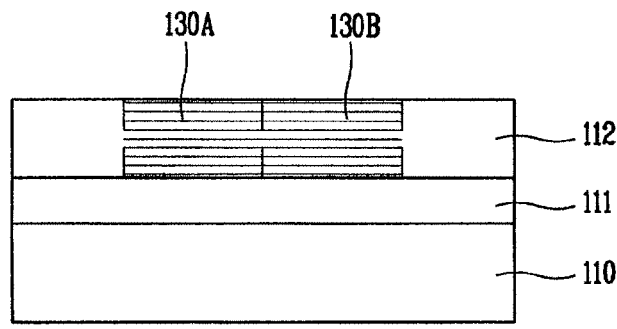
Figure 6A:
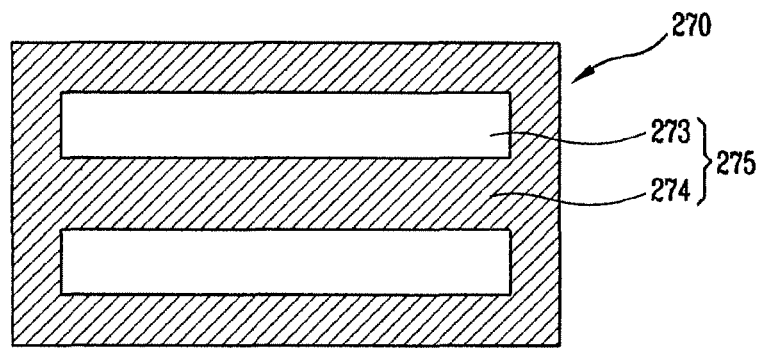
FIG. 6A is a plan view illustrating an example of a laser mask used for a sequential lateral solidification (SLS)

FIG. 6A is a plan view illustrating an example of a laser mask used for a sequential lateral solidification (SLS), which is designed to shorten crystallization time compared to the related art. Referring to FIG. 6A, a laser mask 270 includes a slit type pattern 275 having a rectangular transmitting region 273 with a predetermined width and length. The laser mask 270 includes two rectangular transmitting regions 273 for transmitting light and blocking region 274 for blocking light. A laser beam transmitted through the transmitting regions 273 of the slit 275 crystallizes a silicon thin film according to the shape (e.g., rectangular shape) of the transmitting regions 273.

Figure 6B:
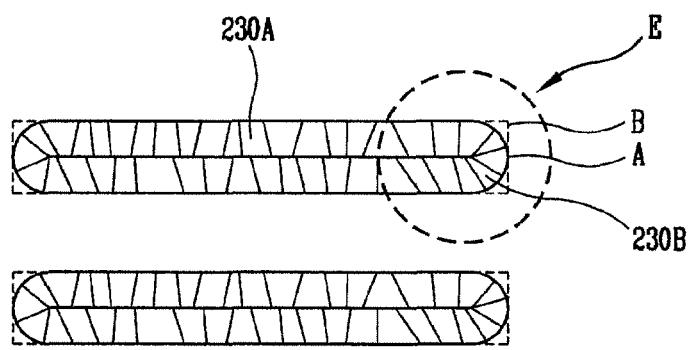
FIG. 6B is a plan view illustrating a silicon thin film crystallized by the mask of FIG. 6A.

Referring to FIG. 6B, however, an edge portion (E) of the crystallized silicon thin film has a round shape different from the mask pattern (the slit 275), due to the diffraction of the laser beam. This will now be described in detail. For reference, the dotted line at the edge portion (E) of the crystallized silicon thin film shown in FIG. 6B illustrates the shape of the slit 275 of the mask 270 used for the crystallization.

Figure 7:
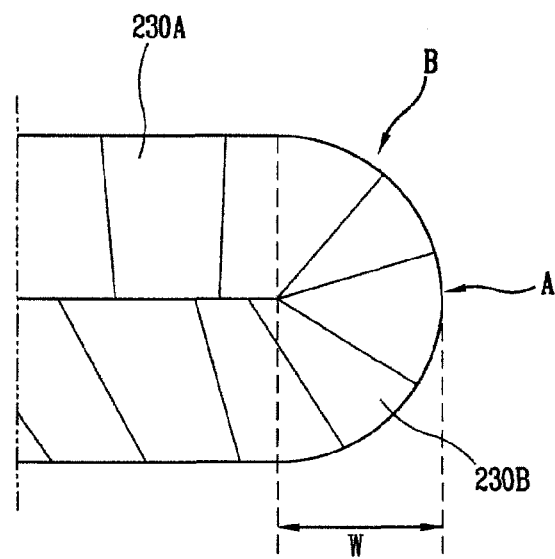
FIG. 7 is an enlarged plan view illustrating the portion 'E' of the crystallized silicon thin film of FIG. 6B.

FIG. 7 is an enlarged plan view illustrating the portion 'E' of the crystallized silicon thin film of FIG. 6B. As shown in HG. 7, a region 'A', the center of the edge portion (E) has a similar crystallization pattern to the slit 275, because the laser beam having an energy density sufficient to completely melt the silicon film is irradiated. However, the laser beam is diffracted at a region 'B', corners of the edge portion (E) of the slit 275. Thus, the laser beam cannot have an energy density sufficient to completely melt the silicon thin film. As a result, the edge portion (E) becomes to have a convex or round shape. In other words, because the grains in the edge portion (E) of the crystallized silicon thin film having the round shape is grown from nuclei formed near the amorphous silicon thin film (solid phase) at the interface of the melted amorphous silicon, a second grain 230B grows in a direction different from a first grain 230A. That is, the second grain 230B has different crystallization characteristics from the first grain 230A, and as a result, a discontinuous region exists in the crystallized silicon thin film. At this time, because the discontinuous region having a width (W), the convex edge portion (E) of the crystallized silicon thin film, has different crystallization characteristics, the width (W) of the discontinuous region needs to be reduced in order to apply the silicon thin film to an LCD device.

Figure 8A:
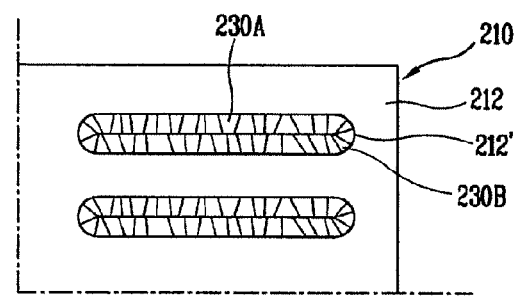
FIGS. 8A to 8C are plan views illustrating a sequential process for crystallizing a silicon thin film using the mask of FIG. 6A.
Figure 8B:
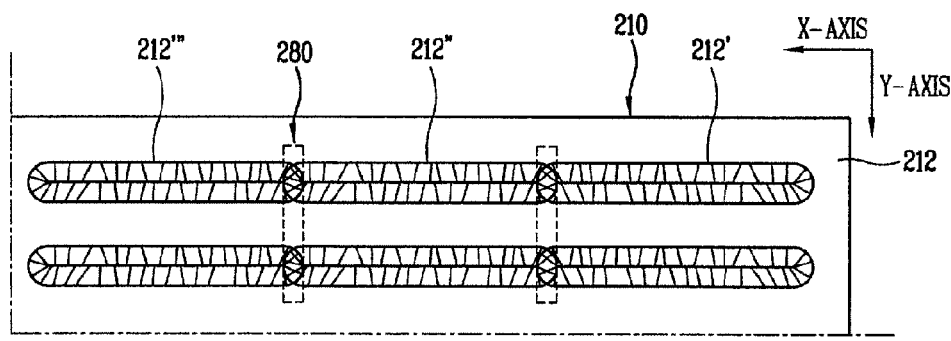
Figure 8C:
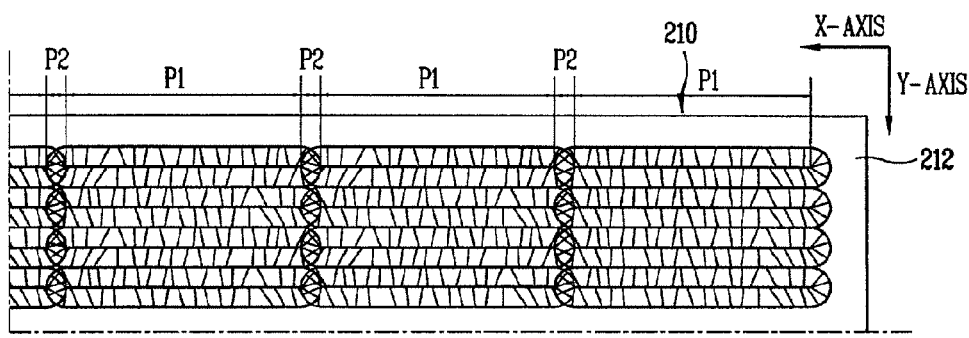

A crystallization process for crystallizing the silicon thin film using the above-described mask will now be described. FIGS. 8A to 8C are plan views illustrating a sequential process for crystallizing a silicon thin film using the mask of FIG. 6A.

First, as shown in FIG. 8A, the mask 270 of FIG. 6A is positioned on a substrate 210 to which a first laser beam is irradiated to crystallize an amorphous silicon thin film 212 formed on the substrate 210. At this time, the crystallized region corresponds to the transmitting region 273 of the mask 270, and when the mask 270 has two transmitting regions, the crystallized region has two crystallized regions having a predetermined length in a horizontal direction. In other words, when the first laser beam is irradiated on the surface of the substrate 210 using the mask 270 including the rectangular slit 275, the silicon thin film, to which the first laser beam has been irradiated through the slit 275, has a first grain 230A grown laterally (vertically in FIG. 8A) from nuclei formed near the amorphous silicon thin film 212 (solid phase) positioned at the upper and lower boundary surfaces. At this time, as mentioned above, the edge portions of the crystallized silicon thin film 212' have a round shape different from the mask pattern, the shape of the slit 275, due to the diffraction of the laser beam, and at the rounded edge portions (E), a second grain 230B grows from nuclei formed near the amorphous silicon thin film 212 (solid phase) positioned at the boundary surface of the melt amorphous silicon in a direction different from the first grain 230A. That is, the second grain 230B has crystallization characteristics different from the first grain 230A, and a discontinuous region exists in the crystallized silicon thin film.

After the first crystallization is completed, the stage (not shown) or the mask 270 placed over the substrate 210 is moved by a short distance not greater than the horizontal length of the pattern of the mask 270 (the width of the slit 275), and then a second laser beam is irradiated to proceed with the crystallization process in the direction of 'X' axis. For example, after the stage is moved in the direction of '−X' axis to overlap the discontinuous region 280 of the slit pattern-crystallized silicon thin film 212', the second laser beam is then irradiated on the surface of the substrate 210.

Then, as shown in FIG. 8B, the second crystallized pattern 212" having the same pattern as the silicon thin film 212' crystallized by the first crystallization is formed in the direction of 'X' axis, while overlapping the discontinuous region 280 of the first crystallized silicon thin film 212'. Thereafter, when a third laser beam is irradiated on the surface of the substrate 210 in the same manner as described with respect to the first laser beam, the third crystallization pattern 212'" having the same pattern as the silicon thin film 212" crystallized by the second crystallization is formed, while overlapping the discontinuous region 280 of the second crystallized silicon thin film 212". At this time, the wider the discontinuous region 280, the wider the overlap region of the laser beam for the next shot, which increases the overall process time. The discontinuous regions 280 of the crystallized silicon thin films 212', 212" and 212'" have different crystallization characteristics, and in this respect, because the silicon thin film 212 around the discontinuous regions 280 remains in an amorphous state, without being crystallized, the next shot of the laser beam is required to overlap these discontinuous regions 280.

After the crystallization process in the direction of 'X' axis is completed, the mask 270 or the stage is moved by a predetermined distance in the direction of 'Y' axis (in case of moving the stage, it is moved in the direction of '−Y' axis). And then, as shown in FIG. 8C, the laser irradiation process is performed again in the direction of 'X' axis, starting from the point where the first crystallization process was finished.

When the above-described crystallization process is repeatedly performed, a problem arises in that the polycrystalline silicon thin film has a plurality of first regions (P1) having normal grains and a plurality of second regions (P2) having the discontinuous regions, which have different crystallization characteristics and are located between the first regions P1. That is, when an LCD device is fabricated by incorporating such a silicon thin film having these discontinuous regions, the LCD device suffers from uneven characteristics, and thus, the quality of the LCD device becomes degraded. In addition, because the silicon thin film around the discontinuous regions remains in an amorphous silicon state, rather than having been crystallized, the next shot of the laser beam is required to overlap these discontinuous regions 280. These overlap regions (namely, X-overlap regions) in which the discontinuous regions overlap each other produce a shot mark. The shot mark decreases picture quality and produces non-uniform device characteristics, when it is applied to an LCD device or an organic light emitting diode.

Meanwhile, although not explained in the above crystallization process, the grains can be grown in the direction of 'Y' axis and the mask overlaps in the direction of 'Y' axis in order to increase the size of the grains, and then, the crystallization can be repeatedly performed. In this case, however, the shot mark may be produced in the overlap regions (namely, Y-overlap regions) in the direction of 'Y' axis.

Figure 9:
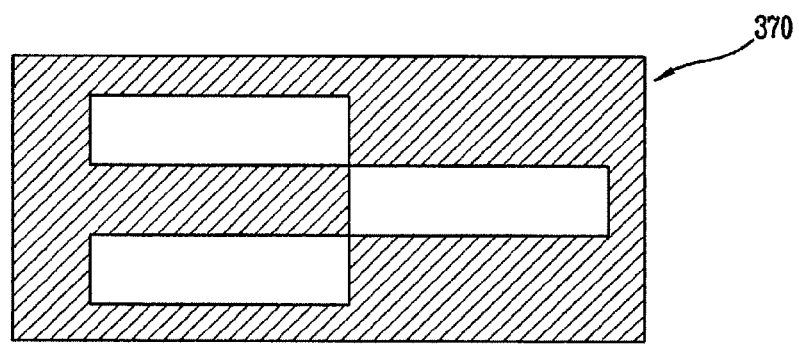
FIG. 9 illustrates another example of a laser mask used for the SLS.

The shot mark is also a critical matter when a laser mask 370 of a single scan method is employed, which is shown in FIG. 9, as well as when the above-described transition method (multiple scan method) is employed. That is, the shot mark problem needs to be solved in every crystallization method where the laser beam overlaps. Thus, the present invention discloses a laser mask and a crystallization method using the same that do not form such an overlap region in a crystallized silicon film. To this end, a laser mask according to the present invention has periodic patterns.

A laser mask according to the present invention is divided into three blocks, each block having a periodic pattern. A laser beam is irradiated onto a silicon thin film three times, each time using one of the three blocks. A silicon thin film crystallized by the above mentioned method (three-shot method) has uniform crystallization characteristics without having X-overlap or Y-overlap regions, due to the periodic patterns of the mask. The crystallized silicon thin film formed by the periodic mask pattern and the three-shot method has uniform grains, which are grown radially, without having a shot mark, which will now be described in detail.

Figure 10:
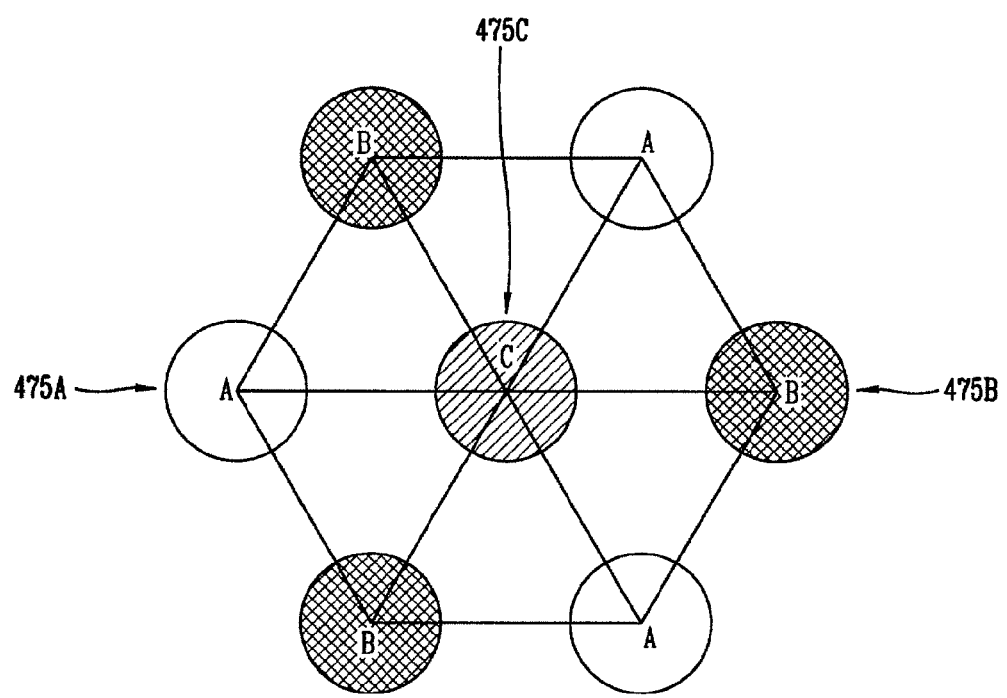
FIG. 10 illustrates a method for constructing periodic patterns in a laser mask according to the present invention.

First, a method for constructing such periodic patterns in a laser mask will now be described. FIG. 10 illustrates a method for constructing periodic patterns in a laser mask according to the present invention. The laser mask has three blocks, each block having its own periodic pattern.

Referring to FIG. 10, a laser mask according to the present invention includes a plurality of transmitting regions having a circular shape. The laser mask is divided into three blocks to solve the shot mark problem. A transmitting region 475A with a position 'A' is formed in a first block, and either a transmitting region 475B with a position 'B' or a transmitting region 475C with a position 'C' is formed in a second block. The positions A, B and C are shown in FIG. 10, and the positions A, B and C and the relationships among them will be described later in detail. Thus, when the second block has the transmitting region 475B, then the third block has the transmitting region 475C. On the other hand, when the second block has the transmitting region 475C, then the third block has the transmitting region 475B. That is, one of the three blocks of the laser mask has one of the transmitting regions 475A to 475C.

Although the laser mask pattern is formed on the basis of the transmitting region 475C of the position 'C', the transmitting region 475A of the position 'A' or the transmitting region 475B of the position 'B' can be used as a reference point. When the transmitting region 475C of the position 'C' is used as a reference point, the transmitting region 475A of the position 'A' and the transmitting region 475B of the position 'B' surround the reference point 475C.

When an amorphous silicon thin film is crystallized using the laser mask having the three patterns 475A to 475C, the neighboring three patterns 475A to 475C form one equilateral triangle, and six equilateral triangles form a regular hexagon, as shown in FIG. 10. In other words, the mask pattern 475C of the position 'C' or the mask pattern 475B of the position 'B' which is formed in the second block, is positioned at the center of the regular hexagon pattern, and the mask patterns different from the center pattern surround the center of the regular hexagon pattern. In addition, when an amorphous silicon thin film is crystallized by sequentially applying the three mask patterns 475A to 475C, the neighboring three patterns 475A to 475C are positioned at the vertexes of the equilateral triangle.

Meanwhile, the size and intervals of the three periodic patterns 475A to 475C should satisfy a certain relationship in order for the laser mask to completely crystallize amorphous silicon by irradiating three times (three-shot) without a shot mark. This will be described as follows.

Figure 11:
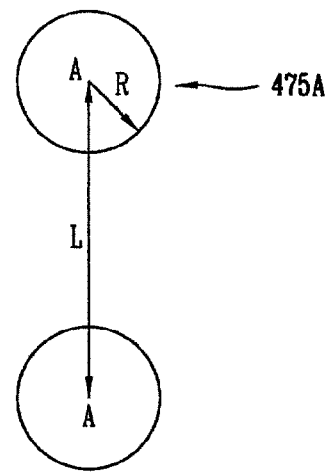
FIG. 11 illustrates a size of a transmitting region of the laser mask of FIG. 10.

FIG. 11 illustrates a size of a transmitting region of the laser mask of FIG. 10, taking an example of the transmitting region of the position 'A'. As shown, assuming that a radius of the transmitting region 475A of the position 'A' is 'R' and a distance between the centers of the transmitting regions 475A is 'L', the radius (R) of the transmitting region should satisfy equation (1) in order to crystallize the overall region.

$$\frac{L}{3} \leq R < \frac{L}{2} \qquad \text{equation (1)}$$

If the radius (R) of the transmitting regions of the mask patterns (475A to 475C) is smaller than L/3, the overall region cannot be crystallized by the three-shot, and if the radius (R) is greater than L/2, then the mask patterns (475A to 475C) contact each other.

Figure 12:
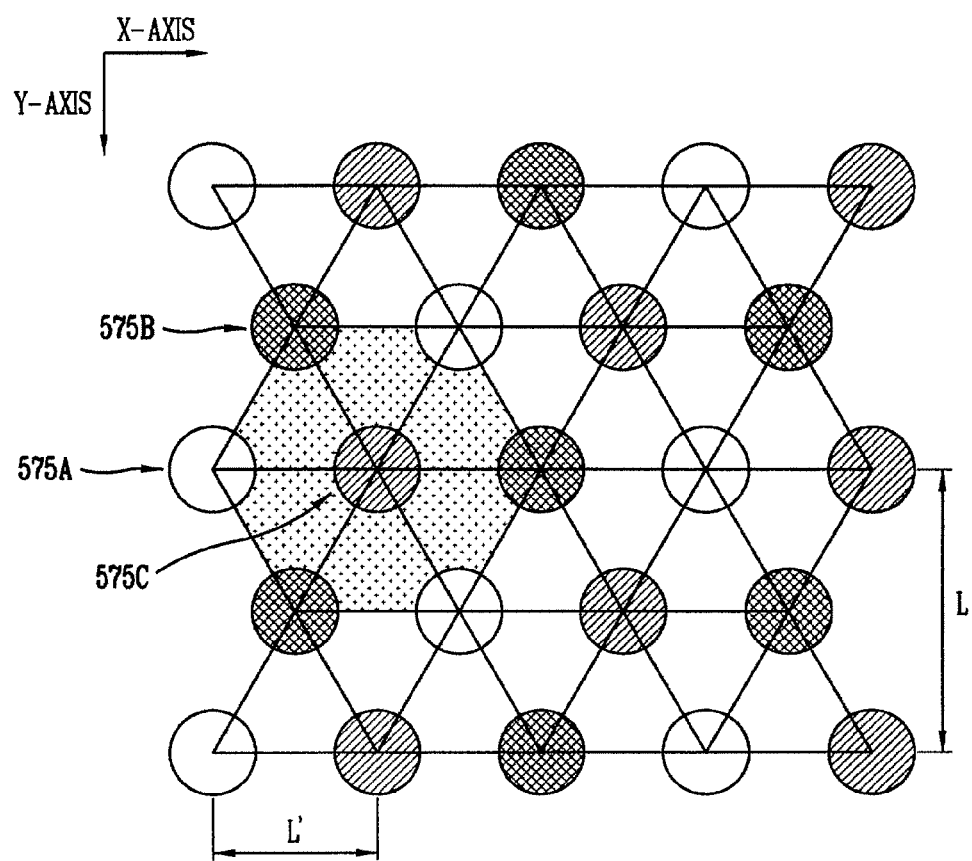
FIG. 12 illustrates a method for constructing mask patterns divided into three blocks for the laser mask of FIG. 10.

A laser mask that has the three mask patterns in three blocks will now be described in detail. FIG. 12 illustrates a method for constructing the mask patterns divided into three blocks for the laser mask of FIG. 10.

Referring to FIG. 12, mask patterns 575A to 575C are positioned in order at the corners of the equilateral triangles, which constitute the regular hexagon shown in FIG. 10. Taking an example of the first row, the mask pattern 575C of the position 'C' and the mask pattern 575B of the position 'B' are repeatedly positioned in order in the direction of the 'X' axis, starting from the mask pattern 575A of the position 'A'. For the second row, after being moved by a distance corresponding to one half of the length (L') of the side of the equilateral triangle in the mask patterns 575A to 575C in the first row, another set of the mask patterns 575A to 575C is positioned. In other words, in the second row, after being moved by L'/2 in the direction of X axis, the mask pattern 575B of the position 'B', the mask pattern 575A of the position 'A' and the mask pattern 575C of the position 'C' are repeatedly positioned in order in the direction of X axis. The three mask patterns 575A to 575C in the second row constitute equilateral triangles together with the neighboring mask patterns 575A to 575C in the first row. The third row (namely, odd number rows) is constructed in the same manner as the first row, and the fourth row (namely, even number rows) is constructed in the same manner as the second row. For the Y-axis direction, the three patterns in the next row is moved a distance by L/2 (namely, ½ of the distance (L) between the centers of the mask patterns 575A to 575C) with respect to the prior row. By dividing the three periodic mask patterns into three blocks in a laser mask and applying the laser mask to the three-shot crystallization method, a crystalline silicon thin film can be obtained without an X-overlap or a Y-overlap. This will now be described.

Figure 13A:
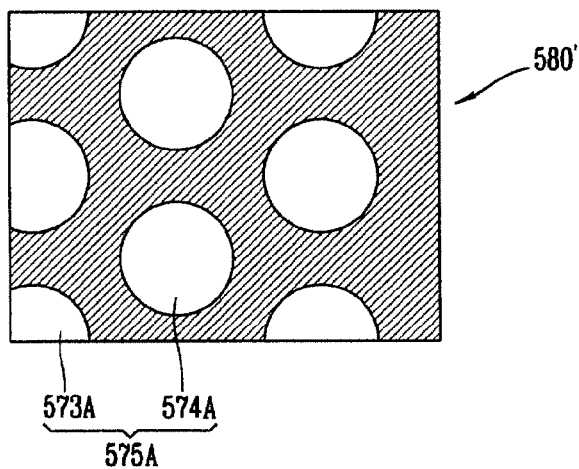
FIGS. 13A to 13C illustrate three blocks of a laser mask constructed according to the method described in FIG. 12.
Figure 13B:
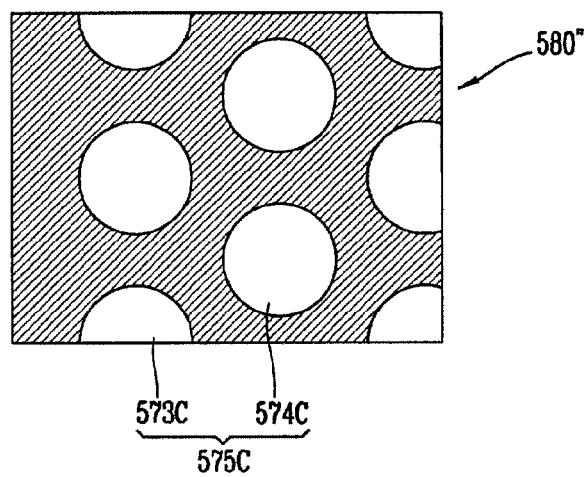
Figure 13C:
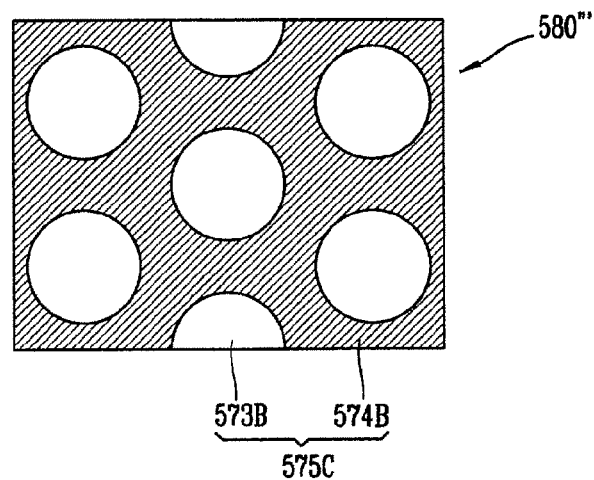

FIGS. 13A to 13C illustrate three blocks of a laser mask constructed according to the method described in FIG. 12. In the laser mask, the mask pattern 575C of the position 'C' is formed in the second block, and the mask pattern 575B of the position 'B' is formed in the third block. As shown, each block (580' to 580''') includes multiple transmitting regions 573A to 573C having a circular shape and blocking regions 574A to 574C for blocking light. The first block 580' includes the mask pattern 575A positioned in the first, fourth and seventh rows of FIG. 12. The second block 580'' includes the mask patterns 575C positioned in the third, sixth and ninth rows. The third block 580''' includes the mask patterns 575B positioned in the second, fifth and eighth rows. Although the transmitting regions of the mask patterns 575A to 575C have a circular shape in the drawings, they can be also formed to have a regular polygon shape such as regular triangle, square, regular hexagon and regular octagon without being limited thereto. In addition, in the drawings, although the radius (R) of the circular mask patterns 575A to 575C is one third of the distance (L) between the centers of mask patterns 575A to 575C, it is not limited thereto, so long as the relationship between R and L satisfies equation 1.

Figure 14A:
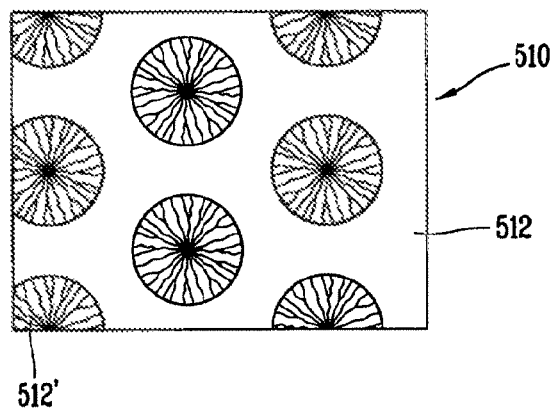
FIGS. 14A to 14C illustrate a process for crystallizing a silicon thin film using the laser mask of FIGS. 13A to 13C.
Figure 14B:
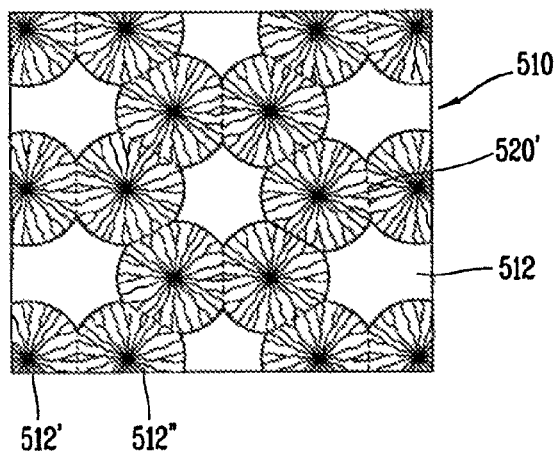
Figure 14C:
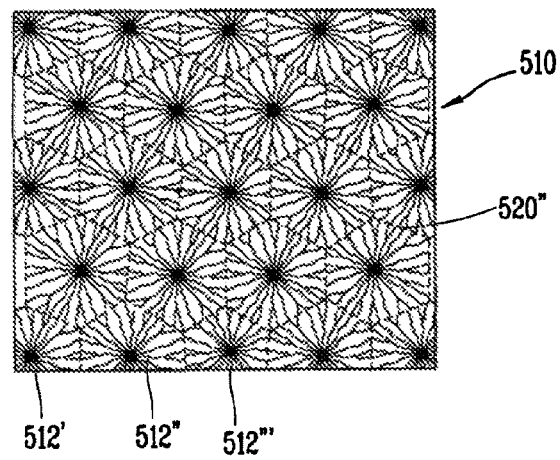

FIGS. 14A to 14C illustrate a process for crystallizing a silicon thin film using the laser mask of FIGS. 13A to 13C. A silicon thin film crystallized by the three-block laser mask having the periodicity described above has uniform crystallization characteristics without a shot mark.

First, as show in FIG. 14A, when a first laser beam is irradiated onto a silicon film 512 on a substrate 510 through the mask pattern 575A of the position 'A' (namely, the transmitting regions 573A of the mask pattern 575A) formed in the first block 580', grains grow toward the centers of the circular pattern 573A using the amorphous silicon thin film (solid phase) 512 positioned at the boundary surface as a nucleus, thereby forming first polycrystalline crystals 512' having a circular shape. The regions crystallized by this first crystallization correspond to the transmitting regions 573A of the laser mask. Thus, if there are eight transmitting regions in the first block of the laser mask, eight polycrystalline crystals 512' having a circular shape will be formed in the silicon thin film 512.

After the first crystallization is completed, a second laser beam is irradiated onto the silicon thin film 512 having the first polycrystalline crystals 512' through the second block 580'' of FIG. 13B. This second crystallization uses the second block 580'', where the mask pattern 575C of the position 'C' is formed, without moving the substrate in the direction X or Y. As a result, as shown in FIG. 14B, starting from the circumferences of the patterns of the first polycrystalline crystals 512', grains grow toward the centers of the mask pattern 575C of the second block 580'' to form the second polycrystalline crystals 512''. The second crystallization is such that three of the first crystals 512' surround one of the second crystals 512'', and the second crystallization starts from the regions in which the mask pattern 575C of the position 'C' overlaps the three first crystals 512'. As a result, the second crystals 512'' grow toward the centers of the mask pattern 575C of the position 'C'.

Next, a third laser beam is irradiated onto the silicon thin film 512 having the first and second polycrystalline crystals 512' and 512'' through the third block 580''' of FIG. 13C, in which the mask pattern 575B of the position 'B' are formed. Then, as shown in FIG. 14C, starting from the regions 520'' where the patterns of the second crystals 512'' overlap the mask pattern 575B of the position 'B', grains grow toward the centers of the mask pattern 575B of the third block 580''' to form the third polycrystalline crystals 512''', which completes the crystallization of the silicon thin film 512.

In this manner, the three-shot method completely crystallizes the silicon film 512 on the substrate 510 using the laser mask without an X-overlap or a Y-overlap, that is, without a shot mark. As explained, the laser mask has three blocks, each block having a periodic pattern. At this time, the first, second and third crystals 512', 512'' and 512''' formed by the three-shot method have the same circular shape as the mask patterns 575A to 575C, and accordingly, the crystallized silicon thin film becomes to have uniform grains, which are grown radially.

Figure 15A:
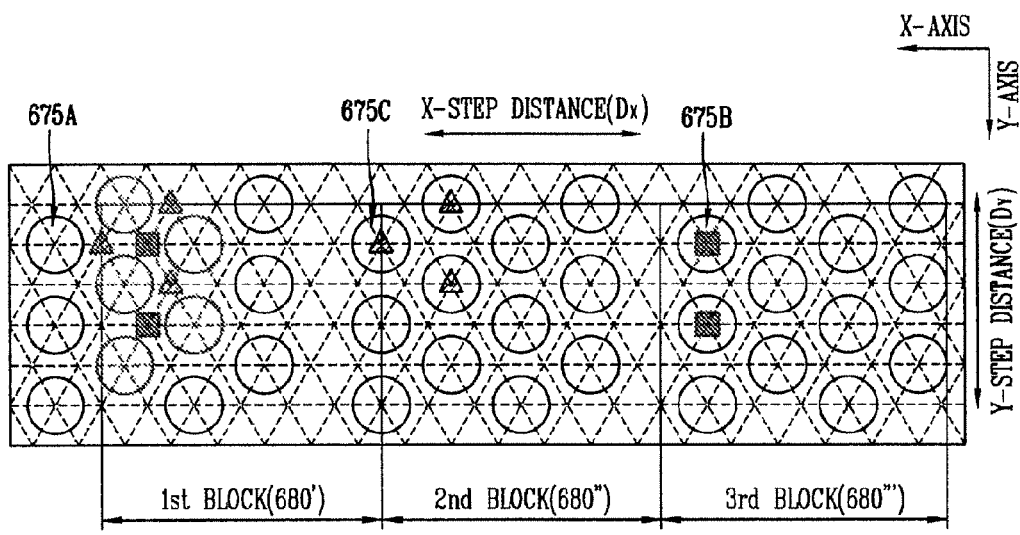
FIG. 15A illustrates a method for constructing a laser mask according to a first embodiment of the present invention.

A laser mask and a process for crystallizing a large-size silicon thin film using the same according to the present invention will now be described. FIG. 15A illustrates a method for constructing a laser mask according to a first embodiment of the present invention.

Referring to FIG. 15A, a mask pattern 675A of the position 'A' is formed in a first block 680' indicated by a square solid line, a mask pattern 675C of the position 'C' is formed in a second block 680'', and a mask pattern 675B of the position 'B' is formed in a third block 680'''. The three mask patterns 675A to 675C are formed in the three blocks 680' to 680''' of the laser mask according to the pattern constructing method of the present invention shown in FIG. 10 or FIG. 12. In the first block 680', twelve transmitting regions (the mask pattern 675A at the position of 'A') having a circular shape are arranged in a 4 columns×3 rows matrix configuration. To be sure, the transmitting regions are arranged crisscross in the odd and even rows so that each row does not correspond with each other, but it is assumed that the transmitting regions are arranged in the same row for convenience of explanation). Like the mask pattern 675A of the position 'A', total twelve transmitting regions of the mask pattern 675C are formed in a 4 columns×3 rows matrix configuration in the second block 680''. The positions of the transmitting regions of the mask pattern 675C correspond to the positions of the triangles in the first block 680'. Also, total 12 transmitting regions of the mask pattern 675B of the position 'B' are formed in a 4 columns×3 rows matrix configuration in the third block 680'''. The positions of the transmitting regions of the mask pattern 675B correspond to the positions of the small squares in the first block 680'.

In this manner, the position of each mask pattern 675A to 675C is consistent with the pattern constructing method of the present invention. That is, assuming that the three patterns are formed in one block, on the basis of the transmitting regions positioned at the first column×first row of the mask pattern 675C (hereinafter 'reference pattern'), the transmitting regions positioned at the first column×first row of the mask pattern 675A of the position 'A' is shifted by one column leftward (that is, it is moved by a distance equal to one side of the small equilateral triangle indicated by a dotted line), and the transmitting regions positioned at the first column×first row of the mask pattern 675B of the position 'B' is shifted by one column rightward. Except for the difference above, the three mask patterns 675A to 675C formed in the three blocks 680' to 680''' have the same configuration of 4 columns×3 rows.

In FIG. 15A, the mask patterns 675A to 675C are also formed outside the three blocks 680' to 680''' indicated by the solid line. The three blocks 680' to 680''' are virtual regions for constructing the periodic patterns 675A to 675C on a laser mask, and thus the mask patterns 675A to 675C can be rearranged in accordance with process conditions such as a laser equipment and an optical system.

The blocks 680' to 680''' can be used as a reference for the next shot during the three-shot crystallization method. According to this, a moving distance in the direction of X axis (namely, the X-step distance (Dx)) is substantially the same as the length of the horizontal side of the square (one block), and a moving distance in the direction of Y axis (namely, Y-step distance (Dy)) is substantially the same as the length of the vertical side of the square. The X-step distance (Dx) means a moving distance of the laser mask or the stage in the direction of X axis for the three-shot method, and the Y-step distance (Dy) means a moving distance of the laser mask or the stage in the direction of Y axis to proceed with the Y-axis crystallization after the X-axis crystallization. The Y-step distance (Dy) also means a moving distance of the mask or the stage in the Y-axis direction so that a lower region of the silicon thin film, which is not irradiated by the three-shot laser beam during the X-axis crystallization, can be crystallized by the three-shot method. The X-step distance (Dx) and the Y-step distance (Dy) are determined in consideration of the periodicity of the three blocks 680' to 680''' in order to remove an X-overlap or a Y-overlap.

Figure 15B:
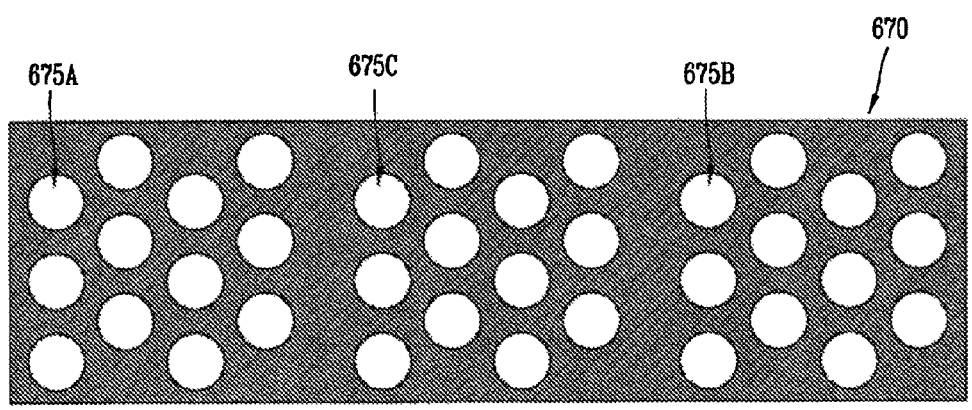
FIG. 15B illustrates an example of a laser mask fabricated by the pattern constructing method with reference to FIG. 15A.

A laser mask having the three mask patterns described above will now be described with an example. FIG. 15B illustrates an example of a laser mask fabricated by the pattern constructing method described with reference to FIG. 15A.

As described above, a laser mask 670 formed by the mask constructing method in accordance with the first embodiment of the present invention has three blocks with the mask pattern 675A of the position 'A', the mask pattern 675C of the position 'C' and the mask pattern 675B of the position 'B'. The laser mask 670 blocks a laser beam except for the transmitting regions of the mask patterns 675A to 675C formed with a certain periodicity. The mask 670 can be made of metal that can block light, such as chrome, aluminum, or the like. Although twelve transmitting regions are formed in each block of the laser mask 670, more than twelve transmitting regions can be formed in each block in consideration of process conditions such as laser equipment or optical system.

A process for crystallizing a large-size silicon thin film using the laser mask will now be described. FIGS. 16A to 16H illustrates a sequential process for crystallizing a silicon thin film using the laser mask shown FIG. 15B.

As shown, three blocks are indicated by a solid line for convenience of explanation. Thus, each block is indicated by a square solid line. In this example, starting from left, a first block 680' corresponds to the mask pattern of the position 'A', a second block 680'' corresponds to the mask pattern of the position 'C', and a third block 680''' corresponds to the mask pattern of the position 'B'.

Referring to FIG. 16A, a first crystallization is performed by irradiating a laser beam onto a silicon film deposited on a substrate through the laser mask shown in FIG. 15B. At this time, the laser beam has an energy density corresponding to the complete melting region as described in the earlier section, and crystals grow toward the centers of the circles using the amorphous silicon (solid phase) positioned at the boundary surface as a nucleus, thereby forming polycrystalline first crystals 612' in a first irradiated region (P1). The first crystals 612' have radial grains. In this case, the entirety of the first irradiated region (P1) is not crystallized, but a plurality of first crystals 612' having a circular shape are formed according to the pattern on the mask 670. In detail, the regions crystallized by the first crystallization correspond to the transmitting regions of the mask 670. Thus, if the mask having the three blocks 680' to 680''' has thirty six transmitting regions, then the silicon film also has thirty six polycrystalline silicon crystals 612', each crystal having a certain radius.

After the first crystallization is completed, the stage (not shown) on which the substrate is placed or the mask 670 is moved in the X-axis direction by a distance of the length of the side of the square (one block), which is the same as the X-step distance (Dx), and then a second laser beam is irradiated. The stage is moved by the X-step distance (Dx) in the "−X"-axis direction, for example, the first crystals 612' of the position 'C' formed by the second block overlaps the mask pattern of the position 'B' in the third block, and then, a second laser beam is irradiated on the surface of the substrate. Then, as shown in FIG. 16B, the second crystals 612'' having the same shape as the first crystals 612' are formed. At this time, the positions of the second crystals 612'' are shifted by the X-step distance (Dx) with respect to the first crystals 612', and thus the second crystals 612'' overlap a portion of the first crystals 612'. The two center regions in FIG. 16B where the first laser shot and the second laser shot overlap each other, that is, where the first irradiated region (P1) and the second irradiated region (P2) overlap each other, are irradiated by the second-shot laser beam, so that starting from the circumferences of the first crystals 612', crystals grow toward the centers of the pattern of the mask 670 of the second shot to form the polycrystalline second crystals 612''. In other words, the three first crystals 612' which have been crystallized through the first crystallization are positioned around the second crystals 612'', and the second crystallization starts from the region 620' where the mask pattern and the three first crystals 612' overlap each other, thereby forming the second crystals 612'' grown toward the centers of the mask pattern (refer to FIG. 14B). In FIG. 16B, the crystals formed by the first block of the mask 670 during the second shot are the first crystals, not the second crystals.

Figure 16C:
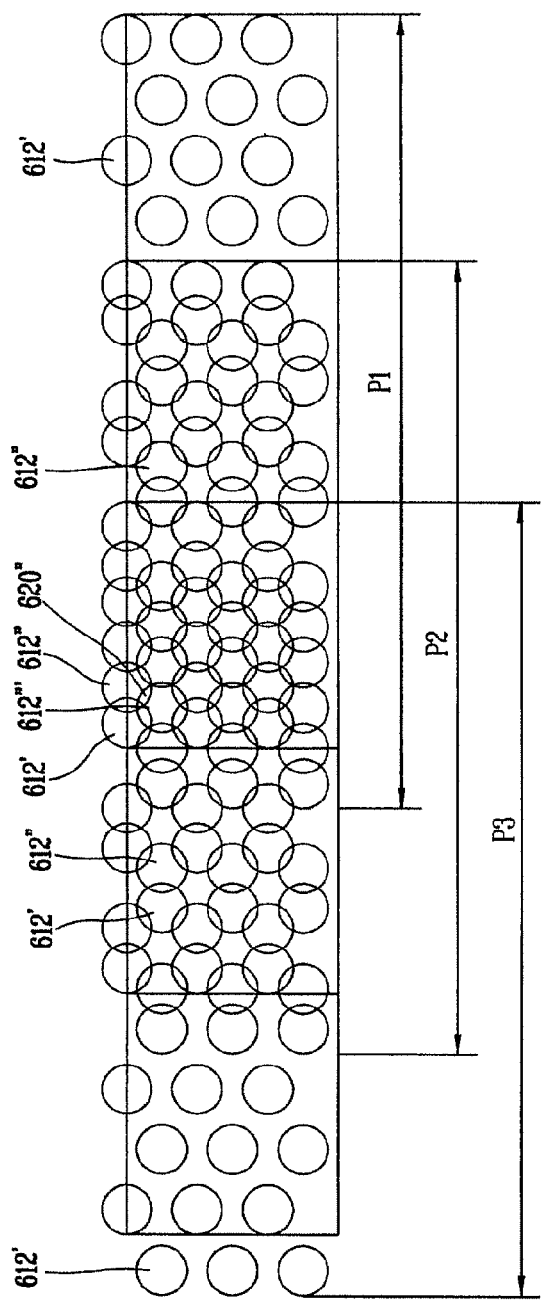

Next, the stage or the mask 670 is moved again by the X-step distance (Dx) in the X-axis direction, and then a third laser beam is irradiated to continuously proceed with the crystallization in the X-axis direction. For example, after the second crystallization is performed by the second laser shot, the third laser beam is irradiated on the surface of the substrate. At this time, the first crystals 612' of the position 'A' formed by the first block overlap the mask pattern of the position 'B' in the third block. Then, as shown in FIG. 16C, the third crystals 612''' having the same shape as the first crystals 612' are formed. At this time, the positions of the third crystals 612''' are shifted by the X-step distance (Dx) with respect to the first crystals 612', and thus overlap a portion of the first crystals 612' and the second crystals 612''. At this time, the center region in FIG. 16C where the first, second and third laser shots overlap each other, that is, where the first irradiated region (P1), the second irradiated region (P2) and the third irradiated region (P3) overlap each other (namely, the region corresponding to the third block of the mask 670 for the third laser irradiation), is irradiated by the third-shot laser beam, so that starting from the circumferences of the patterns of the second crystals 612", crystals grow toward the centers of the pattern of the mask 670 of the third shot to form the polycrystalline third crystals 612'". In other words, the three second crystals 612" which have been crystallized through the second crystallization are positioned around the third crystals 612'", and the third crystallization starts from the region 620" where the mask pattern according to the third shot overlaps the three second crystals 612", thereby forming the third crystals 612'" grown toward the centers of the mask pattern (refer to FIG. 14C). In this manner, after the three-shot crystallization is performed by applying the laser mask having the three blocks, the three-shot region is crystallized without an X-overlap, that is, without a shot mark, as shown in the drawing. That is, the region where the first crystals 612', the second crystals 612" and the third crystals 612'" are all formed corresponds to the three-short region which has been crystallized without a shot mark. In FIG. 16C, the crystals formed by the second block of the mask 670 during the third shot are the second crystals 612" newly formed by the third laser shot after the first crystallization, not the third crystals, and the crystals formed by the first block of the mask 670 during the third shot are the first crystals 612' newly formed by the third laser shot, not the third crystals.

Figure 16D:
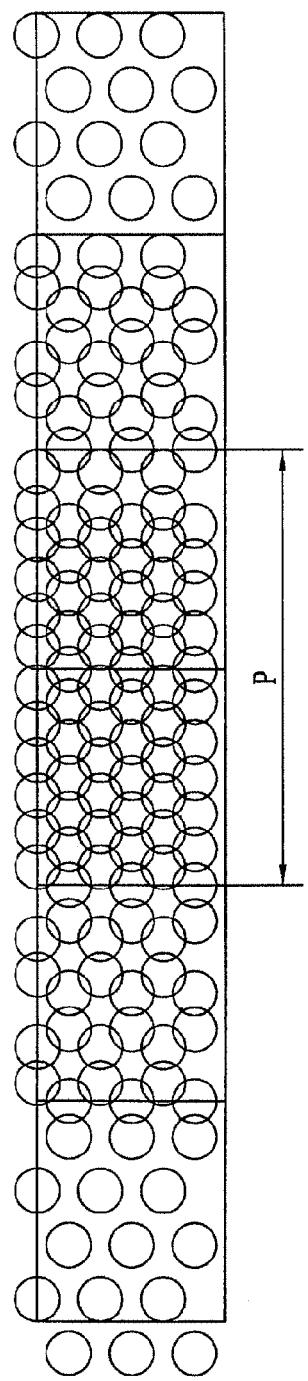

Next, as shown in FIG. 16D, the stage or the mask 670 further is moved again by the X-step distance (Dx) in the X-axis direction, and then a fourth laser beam is irradiated. Then, the three-shot crystal region (P) having uniform crystalline characteristics without an X-overlap or a Y-overlap is formed in the center by the third-shot laser beam. As described above, the three-shot crystal region (P) corresponding to the region of the third crystals 612'" is formed without an X-overlap, namely, without a shot mark. Meanwhile, the crystallization process is repeatedly performed in the X-axis direction. Then, as shown in FIGS. 16E and 16F, the three-shot crystal region (P) without a shot mark increases in the X-axis direction. This three-shot crystal region (P) is a uniform crystal region without a shot mark that is formed using the laser mask having three blocks, each block having a periodic pattern.

Meanwhile, the lower region of the silicon film is not completely irradiated by a laser beam. This is because the crystallization process was performed only in the X-axis direction. After the crystallization process is completed in the X-axis direction (X-axis crystallization), in FIG. 16G the mask 670 or the stage is moved by the Y-step distance (Dy) in the Y-axis direction (in case of moving the stage, in the direction of −Y axis), and then, the crystallization process described above with respect to the X-axis crystallization is continuously performed in the direction of −X axis, starting from the end point where the first X-axis crystallization process was finished. In this case, the crystallization is continuously performed by applying the same blocks of the mask 670 as the X-axis crystallization. The upper pattern (namely, the pattern formed beyond the block region) of the mask 670 is positioned corresponding to the lower region which has not been completely irradiated by a laser beam after the first X-axis crystallization. Thus, the lower region can be completely crystallized by the crystallization process in the direction of the −X axis. With this procedure, the lower region crystallized by the crystallization process in the direction of the −X axis can be formed without a Y-overlap.

Figures 16G, 16H:
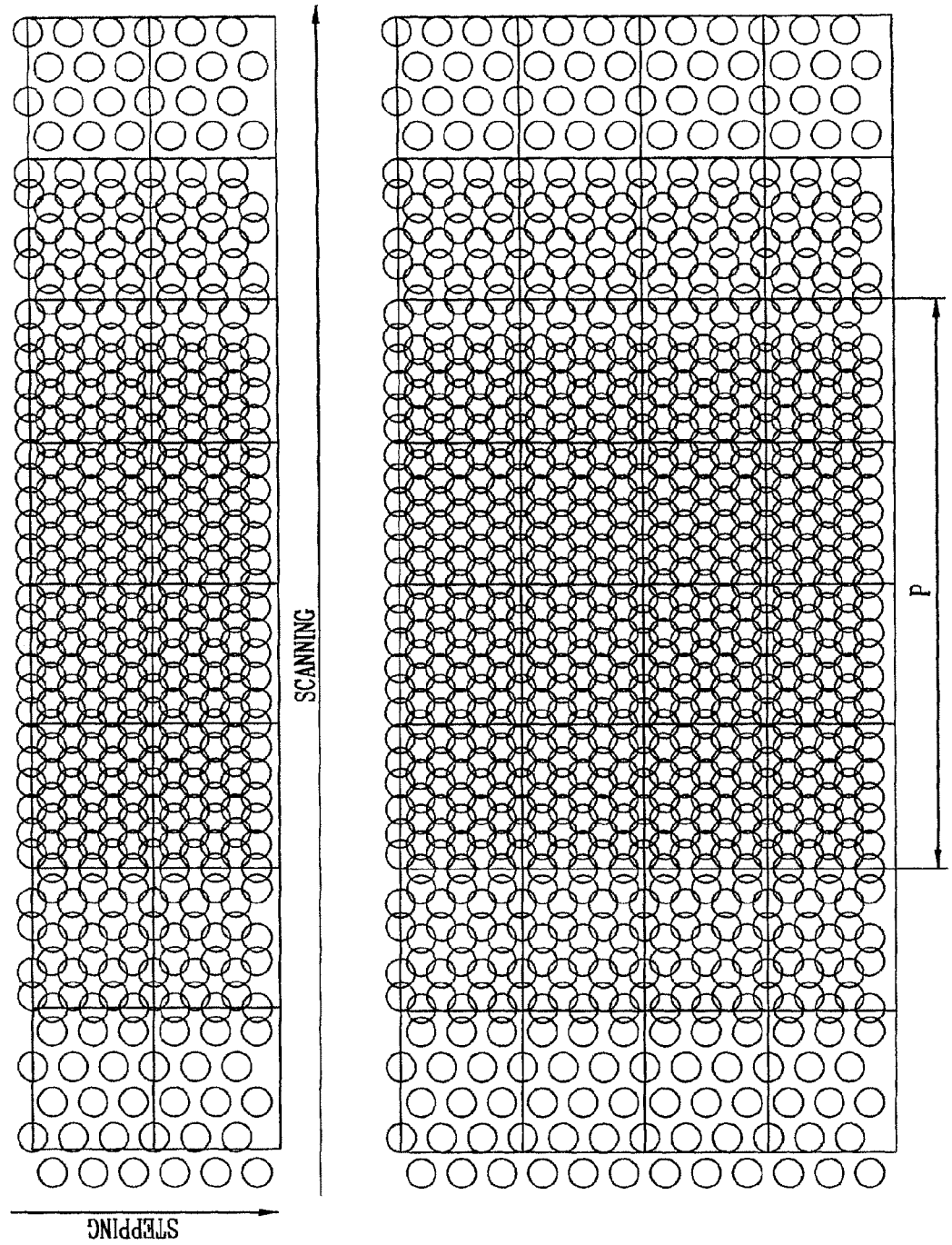

Thereafter, the above-described method is repeatedly applied in the directions of X axis and Y axis to form an arbitrary crystallized region, as shown in FIG. 16H. In particular, the three-shot crystal region (P) is a crystallized region without an X-overlap or a Y-overlap that has uniform crystallization characteristics. This is because this region does not include a shot mark and the crystals have radial grains.

In this embodiment, a crystalline silicon thin film without an X-overlap or a Y-overlap is obtained by the three-shot method using the laser mask having three blocks, each block having a periodic pattern. Although the mask patterns have the transmitting regions having a circular shape, they also can be formed to have a shape of a regular polygon, such as regular triangle, square, regular hexagon, regular octagon, or the like. In addition, although each block has twelve transmitting regions, the number of the transmitting regions in each block can be varied depending on process conditions. Moreover, although the radius (R) of the transmitting regions is one half of the distance (L) between the centers of the transmitting regions, it can be varied, as long as the relationship between R and L satisfies equation 1. In this embodiment, although the mask pattern of the position 'A', the mask pattern of the position 'C' and the mask pattern of the position 'B' are positioned in order in the first to the third blocks of the mask, the positions of the mask patterns can be varied.

Figure 17:
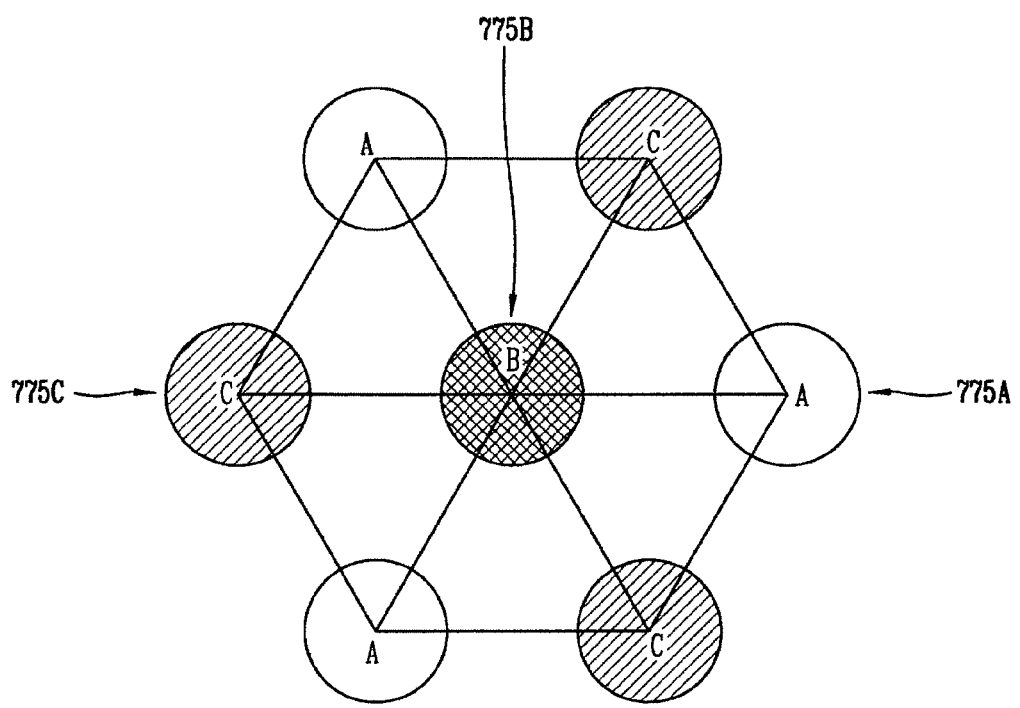
FIG. 17 illustrates a method for constructing periodic patterns in a laser mask according to a second embodiment of the present invention.

Another example of positioning the three mask patterns will now be described in detail. FIG. 17 illustrates a method for constructing periodic patterns in a laser mask according to a second embodiment of the present invention.

Referring to FIG. 17, in constructing circular transmitting regions (A, B and C) in the laser mask, the laser mask is divided into three blocks to remove a shot mark. A laser transmitting region 775A having the position 'A' is formed in a first block, a transmitting region 775B having the position 'B' is formed in the second block, and a transmitting region 775C having the position 'C' is formed in the third block. That is, as mentioned above, the circular mask patterns 775A to 775C are sequentially formed in each of the three blocks of the laser crystallization mask. In this embodiment, the mask pattern 775B of the position 'B' is positioned at the center of the regular hexagon shown in FIG. 17, but the present invention is not limited thereto. The transmitting region 775A of the position 'A' and the transmitting region 775C of the position 'C' surround the reference point 775B. That is, the mask pattern 775B of the position 'B' formed in the third block is positioned at the center of the regular hexagon pattern, around which the different patterns (that is, the mask pattern 775A of the position 'A' and the mask pattern 775C of the position 'C') are positioned. Meanwhile, the size and intervals of the mask patterns 775A to 775C should satisfy equation 1 in order to completely crystallize a silicon thin film by the three-shot method without a shot mark.

Figure 18A:
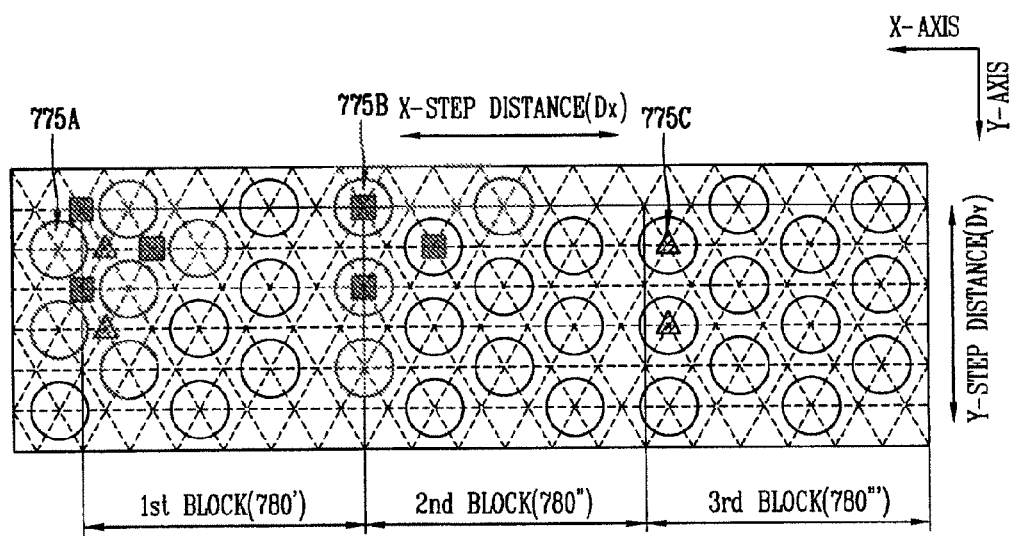
FIG. 18A illustrates a method for constructing a laser mask in accordance with the second embodiment of the present invention.

The laser mask having the mask patterns constructed by the above method and a crystallization process using the laser mask will now be described. FIG. 18A illustrates a method for constructing a laser mask in accordance with the second embodiment of the present invention. The second embodiment of the present invention is the same as the first embodiment of the present invention except for the order of positioning the mask patterns of the position 'B' or 'C' in the second and third blocks.

Referring to FIG. 18A, a mask pattern 775A of the position 'A' is positioned in a first block 780' indicated by a square solid line, a mask pattern 775B of the position 'B' is positioned in a second block 780", and a mask pattern 775C of the position 'C' is positioned in a third block 780'". The three mask patterns 775A to 775C are formed in the three blocks 780' to 780'" of the laser mask according to the pattern constructing method shown in FIG. 17. In the first block 780', twelve transmitting regions having a circular shape (the mask pattern 775A) are arranged in a 4 columns×3 rows matrix configuration. To be sure, the transmitting regions are arranged crisscross in the odd and even rows so that each row does not correspond with each other, but it is assumed that the transmitting regions are arranged in the same row for convenience of explanation). Like the mask pattern 775A of the position 'A', total twelve transmitting regions of the mask pattern 775B are formed in a 4 columns×3 rows matrix configuration in the second block 780". The positions of the transmitting regions of the mask pattern 775B correspond to the positions of the small squares in the first block 780' in FIG. 18A. Also, total twelve transmitting regions of the mask pattern 775C of the position 'C' is formed in a 4 columns×3 rows matrix configuration. The positions of the transmitting regions of the mask pattern 775C correspond to the positions of the triangles in the first block 780' and in the third block 780'" in FIG. 18A.

The position of each mask pattern 675A to 675C is consistent with the pattern constructing method of the present invention. That is, assuming that the three patterns are formed in one block, on the basis of the transmitting regions positioned at the first column×first row of the mask pattern 775B (hereinafter 'reference pattern'), the transmitting regions positioned at the first column×first row of the mask pattern 775A are positioned at the vertexes of the left lower side of the equilateral triangle, and the transmitting regions positioned at the 1 column×1 row of the mask pattern 775C are positioned at the vertexes of the right lower side of the equilateral triangle with respect to the reference pattern. The mask patterns 775A and the mask patterns 775C are shifted by a certain distance (one half of the length of one side of the equilateral triangle leftward/rightward, and the height of the equilateral triangle downward), the three mask patterns 775A to 775C formed in the three blocks 780' to 780'" have the same configuration of 4 columns×3 rows.

Compared to the laser mask constructing method according to the first embodiment of the present invention, the laser mask constructing method according to the second embodiment of the present invention has a different mask design. In other words, in the first embodiment, the mask pattern 'C' is positioned in the second block, whereas the mask pattern 'B' is positioned in the second block in the second embodiment.

Figure 18B:
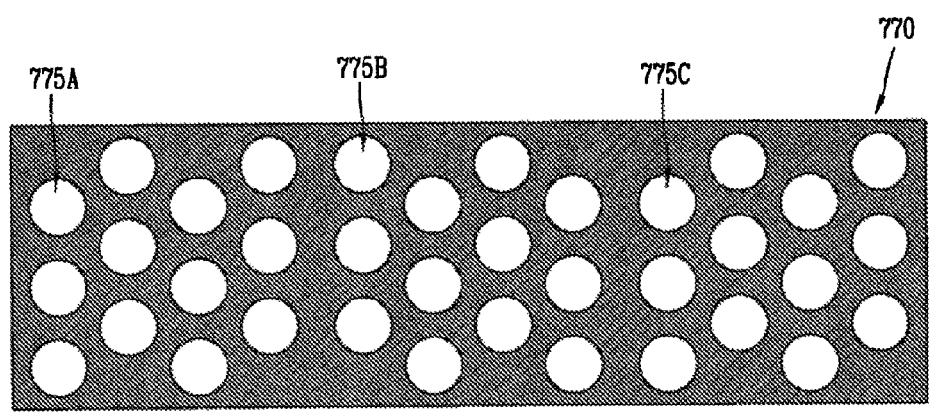
FIG. 18B illustrates an example of a laser mask fabricated by the pattern constructing method described with reference to FIG. 18A.

A laser mask formed by the pattern constructing method described above will now be described with an example. FIG. 18B illustrates an example of a laser mask fabricated by the pattern constructing method described with reference to FIG. 18A.

As described above, a laser mask 770 formed by the mask constructing method in accordance with the second embodiment of the present invention has three blocks with the mask pattern 775A of the position 'A', the mask pattern 775B of the position 'B' and the mask pattern 775C of the position 'C'. In this embodiment, twelve transmitting regions are formed in each block of the laser mask 770, more than twelve transmitting regions can be formed in consideration of process conditions, such as laser equipment or optical system, without being limited thereto.

A process for crystallizing a large-size silicon thin film using the laser mask will now be described. FIGS. 19A to 19G illustrates a sequential process for crystallizing a silicon thin film using the laser mask shown in FIG. 18B.

As shown, three blocks are indicated by a solid line for convenience of explanation. Thus, each block is indicated by a square solid line. In this example, starting from left, a first block 780' corresponds to the mask pattern of the position 'A', a second block 780" corresponds to the mask pattern of the position 'B', and a third block 780'" corresponds to the mask pattern of the position 'C'.

Referring to FIG. 19A, a first crystallization is performed by irradiating a laser beam onto a silicon film deposited on a substrate through the laser mask shown in FIG. 18B. At this time, the laser beam has an energy density corresponding to the complete melting region as described in the earlier section, and crystals grow toward the centers of the circles using the amorphous silicon (solid phase) positioned at the boundary surface as a nucleus, thereby forming polycrystalline first crystals 712' in a first irradiated region (P1). The first crystals 712' have radial grains.

After the first crystallization is completed, the stage (not shown) on which the substrate is placed or the mask 770 is moved in the X-axis direction by a distance of the length (Dx) of the side of the square (one block), and then a second laser beam is irradiated. The stage is moved by the X-step distance (Dx) in the "−X"-axis direction, for example, the first crystals 712' of the position 'B' in the second block overlap the mask pattern of the position 'C' in the third block, and then, the second laser beam is irradiated on the surface of the substrate. Then, as shown in FIG. 19B, the second crystals 712" having the same shape as the first crystals 712' are formed. At this time, the positions of the second crystals 712" are shifted by the X-step distance (Dx) with respect to the first crystals 712', and thus the second crystals 712" overlap a portion of the first crystals 712'. The two center regions in FIG. 19B where the first laser shot and the second laser shot overlap each other, that is, where the first irradiated region (P1) and the second irradiated region (P2) overlap each other, are irradiated by the second-shot laser beam, so that starting from the region 720', where the mask pattern for the second shot overlaps the first crystals 712', crystals grow toward the centers of the pattern of the mask 770 of the second shot to form the polycrystalline second crystals 712" (refer to FIG. 14B). In FIG. 19B, the crystals formed by the first block of the mask 770 during the second shot are the first crystals, not the second crystals.

Figure 19C:
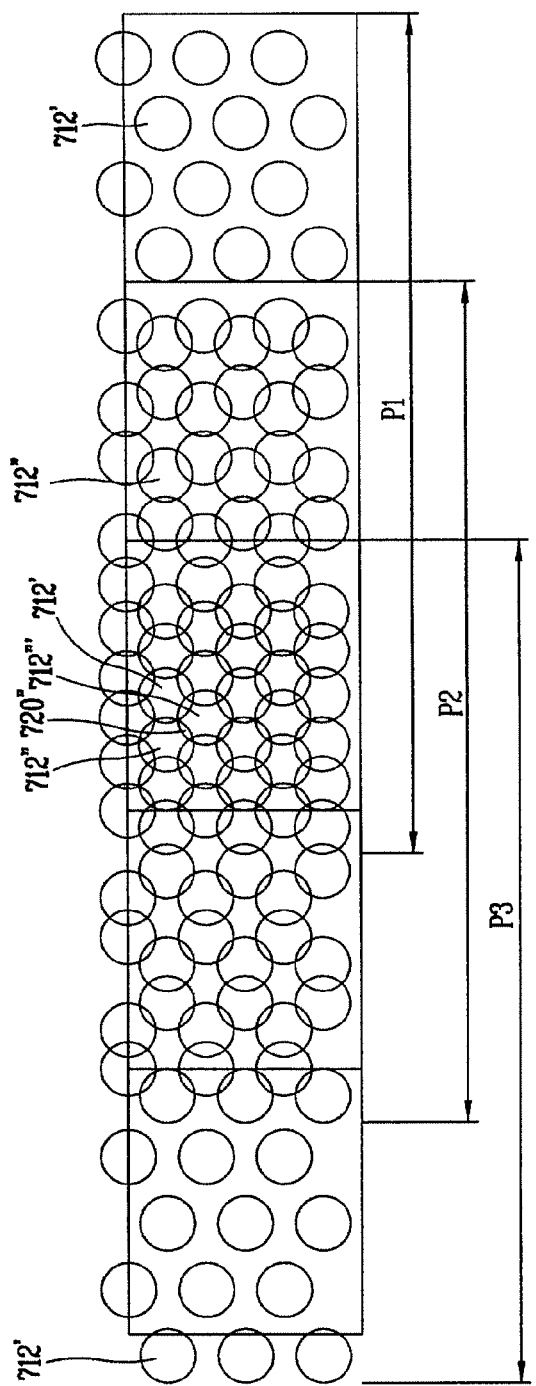

Next, the stage or the mask 770 is moved again by the X-step distance (Dx) in the X-axis direction, and then a third laser beam is irradiated to continuously proceed with the crystallization in the X-axis direction. For example, after the second crystallization is performed by the second laser shot, the third laser beam is irradiated on the surface of the substrate. At this time, the first crystals 712' of the position 'A' formed by the first block overlap the mask pattern of the position 'C' in the third block. Then, as shown in FIG. 19C, the third crystals 712'" having the same shape as the first crystals 712' are formed. At this time, the center region in FIG. 19C where the first, second and third laser shots overlap each other, that is, where the first irradiated region (P1), the second irradiated region (P2) and the third irradiated region (P3) overlap each other (namely, the region corresponding to the third block of the mask 770 for the third laser irradiation), is irradiated by the third-shot laser beam, so that starting from the circumferences of the patterns of second crystals 712" (specifically, the region 720" where the mask pattern for the third shot overlaps the second crystals 712"), crystals grow toward the centers of the pattern of the mask 770 of the third shot to form the polycrystalline third crystals 712'" (Refer to FIG. 14C). In this manner, after the three-shot crystallization is performed by applying the mask having the three blocks, the three-shot region is crystallized without an X-overlap, that is, without a shot mark as shown in the drawing. In FIG. 19C, the crystals formed by the second block of the mask 770 during the third shot are the second crystals 712" newly formed by the third laser shot after the first crystallization, not the third crystals, and the crystals formed by the first block of the mask 770 during the third shot are the first crystals 712' newly formed by the third laser shot, not the third crystals.

Figure 19D:
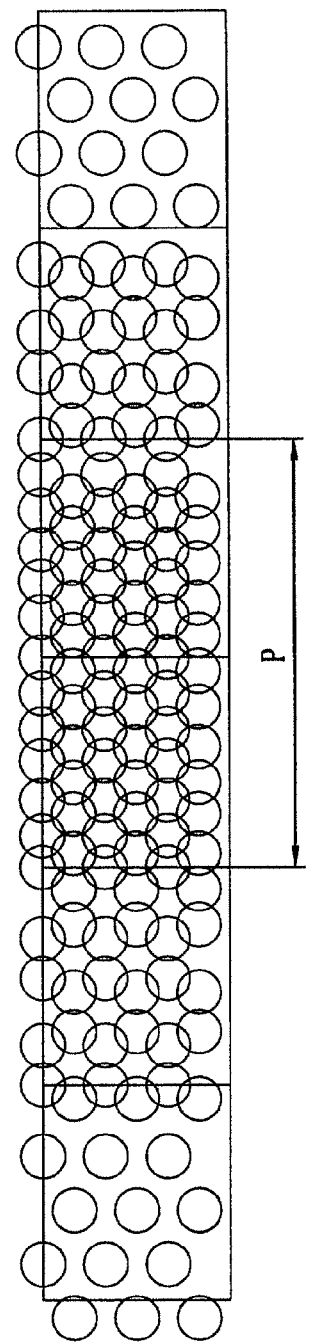
Figure 19E:
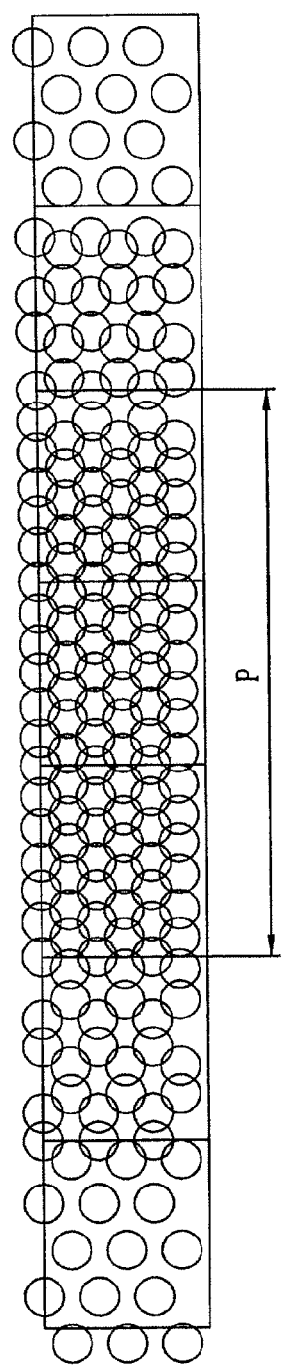
Figure 19F:
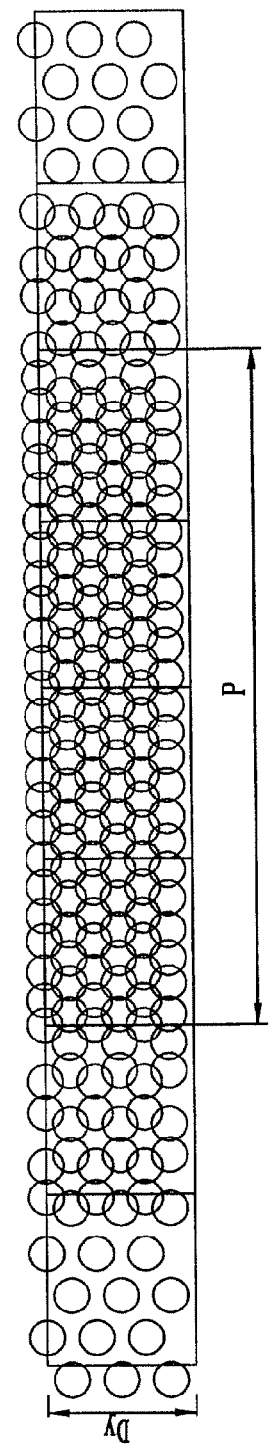

Next, as shown in FIG. 19D, the state or the mask 770 is further moved again by the X-step distance (Dx) in the X-axis direction, and then a fourth laser beam is irradiated. Then, the three-short crystal region (P) having uniform crystalline characteristics without an X-overlap or a Y-overlap is formed in the center by the third-shot laser beam. As described above, the three-shot crystal region (P) corresponding to the region of the third crystals 712''' is formed without an X-overlap, that is, without a shot mark. Meanwhile, the crystallization process is repeatedly performed in the X-axis direction. Then, as shown in FIGS. 19E and 19F, the three-shot crystal region (P) without a shot mark increases in the X-axis direction. This three-shot crystal region (P) is a uniform crystal region without a shot mark that is formed using the laser mask having the three blocks, each having a periodic pattern.

Figure 19G:
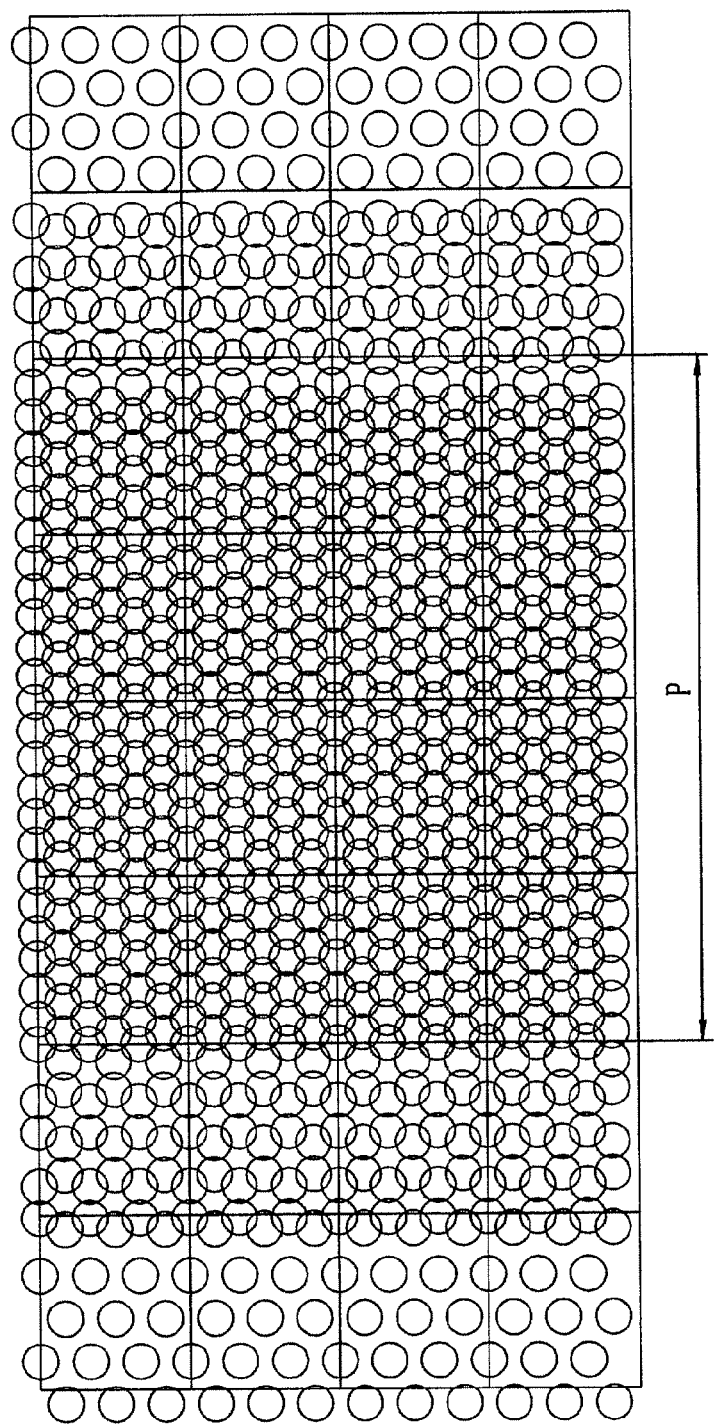

Next, after the crystallization process is completed in the X-axis direction (first X-axis crystallization), the mask 770 or the stage is moved by the Y-step distance (Dy) in the Y-axis direction (in case of moving the stage, in the direction of –Y axis), and then, the crystallization process described above with respect to the X-axis crystallization is continuously performed in the direction of –X axis, starting from the end point where the first X-axis crystallization process was finished. In this case, the crystallization is continuously performed by applying the same blocks of the mask 770 as the first X-axis crystallization. The upper pattern (namely, the pattern formed beyond the block region) of the mask 770 is positioned corresponding to the lower region which has not been completely irradiated by a laser beam after the first X-axis crystallization. The lower region can be completely crystallized by the crystallization process in the direction of the –X axis. With this procedure, the lower region crystallized by the crystallization process in the direction of the –X axis can be formed without a Y-overlap. Thereafter, the above-described method is repeatedly applied in the directions of X axis and Y axis to form an arbitrary crystallized region, as shown in FIG. 19G.

In the second embodiment, although the mask pattern of the position 'A', the mask pattern of the position 'C' and the mask pattern of the position 'B' are sequentially positioned in the first to the third blocks of the laser mask, it is not limited thereto. For example, either the mask pattern of the position 'C' or the mask pattern of the position 'B' can be positioned in the first block while maintaining the order of the three mask patterns in the same manner.

As described in the first and second embodiments of the present invention, laser beams are irradiated onto a silicon thin film through the three mask patterns formed in the three blocks of the laser mask. Accordingly, the portion of the silicon thin film irradiated by the three-shot laser irradiation is completely crystallized. The three-shot method includes the first crystallization by the first shot, the second crystallization by the second shot and the third crystallization by the third shot. In the first crystallization, crystals grow toward the centers of the circles using the amorphous silicon thin film (solid phase) positioned around the circular pattern as a nucleus, that is at the boundary surface of the circumferences. In the second and third crystallizations, crystals grow toward the centers of the mask patterns of the second shot and the third shot using the circumferences of the first and second crystals as a start point.

Figure 20:
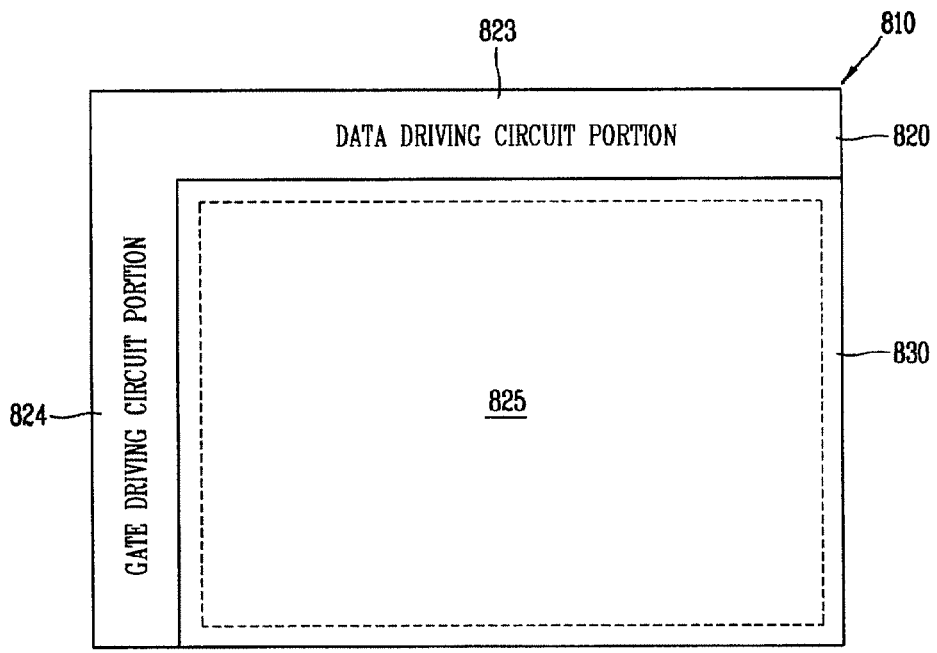
FIG. 20 is a plan view illustrating a structure of a liquid crystal display panel, in which a driving circuit is integrated with the array substrate of the LCD panel.

A method for fabricating an LCD device using the silicon thin film having the improved crystallization characteristics in accordance with the present invention will now be described. FIG. 20 is a plan view illustrating a structure of a liquid crystal display panel, in which a driving circuit is integrated with the array substrate of the LCD panel.

As shown, the driving circuit-integrated LCD panel includes an array substrate 820, a color filter substrate 830, and a liquid crystal layer (not shown) formed between the array substrate 820 and the color filter substrate 830. The array substrate 820 includes a pixel unit 825, an image display region where unit pixels are arranged in a matrix configuration, and a gate driving circuit unit 824 and a data driving circuit unit 823 positioned at an outer edge of the pixel unit 825. Though not shown, the pixel unit 825 of the array substrate 820 includes a plurality of gate lines and data lines arranged vertically and horizontally and defining a plurality of pixel regions on the substrate 820. The pixel unit further includes a thin film transistor, a switching device formed near the crossings of the gate lines and the data lines, and pixel electrodes formed at the pixel regions. As a switching device for applying a signal voltage to the pixel electrode, the thin film transistor (TFT) is a field effect transistor (FET) for controlling a flow of current by an electric field.

Of the array substrate 820, the data driving circuit unit 823 is positioned at the longer side of the array substrate 820 which is protruded compared with the color filter substrate 830, and the gate driving circuit unit 824 is positioned at the shorter side of the array substrate 820. In order to suitably output an inputted signal, the gate driving circuit unit 824 and the data driving circuit unit 823 use a thin film transistor with a CMOS (Complementary Metal Oxide Semiconductor) structure, an inverter. For reference, the CMOS is an integrated circuit with a MOS structure used for high signal processing, and needs P channel and N channel transistors. Its speed and density characteristics are in between the NMOS and the PMOS. The gate driving circuit unit 824 and the data driving circuit unit 823, which are devices for supplying a scan signal and a data signal to the pixel electrode through the gate line and the data line, are connected to an external signal input terminal (not shown) so as to control an external signal transmitted through the external signal input terminal and output it to the pixel electrode.

Though not shown, a color filter for implementing color and a common electrode, which is a counter electrode of the pixel electrode formed on the array substrate 820, are formed on the image display region 825. A spacer between the array substrate and the color filer substrate is formed to provide a uniform cell gap. The array substrate and the color filter substrate are attached by a seal pattern formed at an outer edge of the image display region, to form a unit liquid crystal display panel. The two substrates are attached through an attachment key formed at the array substrate or the color filter substrate. The driving circuit-integrated LCD panel using the polycrystalline silicon thin film has many advantages in that it has excellent device characteristics, excellent picture quality, adequate display capability and low power consumption.

Figure 21:
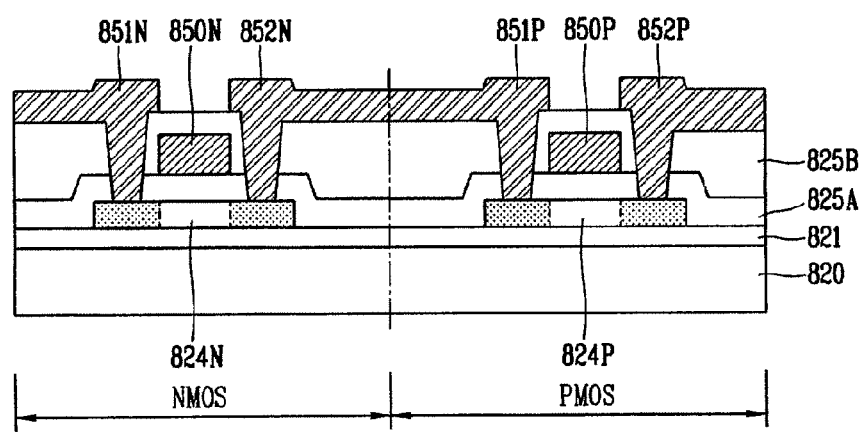
FIG. 21 illustrates an example of an LCD device fabricated using a silicon thin film crystallized by a crystallization method in accordance with the present invention.

A driving circuit-integrated LCD device using the crystallized silicon thin film fabricated according to the present invention will now be described through its fabrication process. FIG. 21 illustrates an example of an LCD device fabricated using a silicon thin film crystallized by a crystallization method in accordance with the present invention. As for the thin film transistor (TFT) formed at the pixel unit, both N-type and P-type TFT are available. For the driving circuit unit, either the N-type TFT or the P-type TFT can be used as in the pixel unit, or the CMOS structure having both the N-type TFT and the P-type TFT can be also used. Herein, FIG. 21 illustrates an example of the CMOS liquid crystal display device.

A method for fabricating the CMOS LCD device will be described as follows. First, a buffer layer 821 made of a silicon oxide film (SiO$_2$) is formed on a substrate 820 made of a transparent insulation material such as glass. Next, active layers 824N and 824P made of polycrystalline silicon are formed on the buffer layer-formed substrate 820. To this end, after an amorphous thin film is formed on the entire surface of the substrate 820, the active layers 824N and 824P are sequentially laterally solidified by a three-shot crystallization method that is in accord with the present invention. At this time, the three-shot crystallization method uses a laser mask having three blocks, each block having a periodic pattern. Accordingly, a uniform polycrystalline silicon thin film can be formed without a short mark.

Thereafter, the crystallized polycrystalline silicon thin film is patterned through a photolithography process in order to form the active patterns 824N and 824P at the NMOS and PMO regions. Then, a gate insulation film 825A is deposited on the active layers 824N and 824P. Subsequently, gate electrodes 850N and 850P made of molybdenum (Mo), aluminum (Al), an aluminum alloy or the like is formed on a certain region (namely, a channel formation region of the active layers 824N and 824P) on the gate insulation film 825. The gate electrodes 850N and 850P are formed by a photolithography process after a gate metal is deposited on the gate insulation film 825A. Then, a N-doping process and a P-doping process are sequentially performed to form an N-type TFT (namely, a TFT having source/drain regions 822N and 823 formed by implanting N+ ions at a certain region of the active layer 824N) and a P-type TFT. At this time, the source region 822N and the drain region 823N of the N-type TFT are formed by injecting a fifth-group element such as phosphor (P) that can donate an electron. The source/drain regions 822P and 823P of the P type TFT are formed by injecting a third-group element such as boron (B) that can donate a hole. Thereafter, an interlayer insulation film 825B is deposited on the entire surface of the substrate 820, and contact holes 860N and 860P are formed to expose a portion of the source/drain regions 822N, 822P, 823N and 823P by a the photolithography process. Finally, source/drain electrodes 851N, 851P, 852N and 852P are formed to be electrically connected with the source/drain regions 822N, 822P, 823N and 823P through the contact holes 860N and 860P, thereby completing a CMOS liquid crystal display device. Although the present invention presents a method for fabricating a LCD device having the crystallized silicon thin film, the principles of the present invention can be also applied to other display devices such as an organic EL, without being limited thereto.

As so far described, the laser mask and the crystallization method according to the present invention have many advantages. A laser mask according to the present invention has three blocks, each block having its own periodic pattern. With a crystallization method according to the present invention, which uses the laser mask, a polycrystalline silicon thin film can be obtained without an X overlap or a Y overlap, that is, without a shot mark, by repeatedly applying the three blocks. In addition, by fabricating a liquid crystal display device using the polycrystalline silicon thin film, the device can have uniform and improved characteristics due to the crystallization characteristics of the active layer. Moreover, because the active layer does not have a shot mark, the picture quality of the liquid crystal display device can be also improved.

It will be apparent to those skilled in the art that various modifications and variations can be made in the above-discussed display device and the driving method thereof without departing from the spirit or scope of the invention. Thus, it is intended that the present invention cover the modifications and variations of this invention provided they come within the scope of the appended claims and their equivalents.

What is claimed is:

1. A crystallization method using a mask comprising:
providing a substrate having a semiconductor layer;
positioning a mask over the substrate, the mask having first, second and third blocks, each block having a periodic pattern including a plurality of transmitting regions and a blocking region, the periodic pattern of the first block having a first position, the periodic pattern of the second block having a second position, the periodic pattern of the third block having a third position, the first, second and third positions being different from each other,
wherein when the three periodic patterns are projected in one block, the adjacent three transmitting regions form one equilateral triangle, and six of the equilateral triangles form a regular hexagon; and
crystallizing the semiconductor layer by irradiating a laser beam through the mask.

2. The method according to claim 1, wherein the transmitting regions have a shape of a circle.

3. The method according to claim 2, wherein a distance between the centers of the transmitting regions is L, a radius of the transmitting regions having a circular shape is R, and L and R have a relationship of $$\frac{L}{3} \le R < \frac{L}{2}.$$

4. The method according to claim 1, wherein the transmitting regions have a shape of a polygon, the polygon including triangle, square, hexagon and octagon.

5. The method according to claim 1, wherein the transmitting regions in each block are arranged in an N columns×M rows matrix configuration (each of N and M is an integer).

6. The method according to claim 5, wherein the transmitting regions in each block are arranged crisscross in odd and even rows.

7. The method according to claim 1, wherein the mask is made of metal, the metal including chrome or aluminum.

8. The method according to claim 1, wherein the crystallizing the semiconductor layer further includes:
irradiating a first laser beam through the mask for forming a first crystallized region, wherein a size of the first crystallized region is W;
moving the substrate by less than W;
irradiating a second laser beam through the mask for forming a second crystallized region;
moving the substrate by less than W; and
irradiating a third laser beam through the mask for forming a third crystallized region.

9. The method according to claim 8, wherein the substrate moves by about one third of W.

10. The method according to claim 1, wherein the crystallizing the semiconductor layer further includes:
irradiating a first laser beam through the mask for forming a first crystallized region;
moving the mask by about a distance equal to a size of one block;
irradiating a second laser beam through the mask for forming a second crystallized region;
moving the mask by about a distance equal to a size of one block; and irradiating a third laser beam through the mask for forming a third crystallized region.

11. The method according to claim 1, wherein the irradiated laser has an energy density of a complete melting region.

12. The method according to claim 1, wherein the semiconductor layer is crystallized by a sequential lateral solidification (SLS) method.

* * * * *